United States Patent
Ohnishi et al.

(10) Patent No.: US 6,399,993 B1
(45) Date of Patent: Jun. 4, 2002

(54) SEMICONDUCTOR DEVICE AND METHOD FOR FABRICATING THE SAME

(75) Inventors: Teruhito Ohnishi; Akira Asai, both of Osaka; Takeshi Takagi, Kyoto; Tohru Saitoh, Osaka; Yo Ichikawa, Aichi; Yoshihiro Hara, Osaka; Koichiro Yuki, Osaka; Katsuya Nozawa, Osaka; Koji Katayama, Nara; Yoshihiko Kanzawa, Osaka, all of (JP)

(73) Assignee: Matsushita Electric Industrial Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/786,551
(22) PCT Filed: Jul. 6, 2000
(86) PCT No.: PCT/JP00/04478
§ 371 (c)(1), (2), (4) Date: Mar. 7, 2001
(87) PCT Pub. No.: WO01/04960
PCT Pub. Date: Jan. 18, 2001

(30) Foreign Application Priority Data

Jul. 7, 1999 (JP) .................................. 11-192706

(51) Int. Cl.$^7$ .............................................. H01L 29/72
(52) U.S. Cl. ....................... 257/370; 257/371; 257/374; 257/376; 257/377; 257/378
(58) Field of Search ................................. 257/370, 371, 257/374, 376, 377, 378

(56) References Cited

U.S. PATENT DOCUMENTS

| 5,015,594 A | 5/1991 | Chu et al. |
| 5,296,391 A | 3/1994 | Sato et al. |
| 5,391,503 A * | 2/1995 | Miwa et al. ................ 257/310 |
| 5,443,994 A | 8/1995 | Solheim |
| 5,523,242 A | 6/1996 | Maeda et al. |

FOREIGN PATENT DOCUMENTS

| EP | 0 740 351 | 10/1996 |
| JP | 09-283533 | 10/1997 |
| JP | 11-214401 | 8/1999 |

* cited by examiner

Primary Examiner—Edward Wojciechowicz
(74) Attorney, Agent, or Firm—Eric J. Robinson; Nixon Peabody LLP

(57) ABSTRACT

In a bipolar transistor block, a base layer (20a) of SiGe single crystals and an emitter layer (26) of almost 100% of Si single crystals are stacked in this order over a collector diffused layer (9). Over both edges of the base layer (20a), a base undercoat insulating film (5a) and base extended electrodes (22) made of polysilicon are provided. The base layer (20a) has a peripheral portion with a thickness equal to that of the base undercoat insulating film (5a) and a center portion thicker than the peripheral portion. The base undercoat insulating film (5a) and gate insulating films (5b and 5c) for a CMOS block are made of the same oxide film. A stress resulting from a difference in thermal expansion coefficient between the SiGe layer as the base layer and the base undercoat insulating film 5a can be reduced, and a highly reliable BiCMOS device is realized.

10 Claims, 18 Drawing Sheets

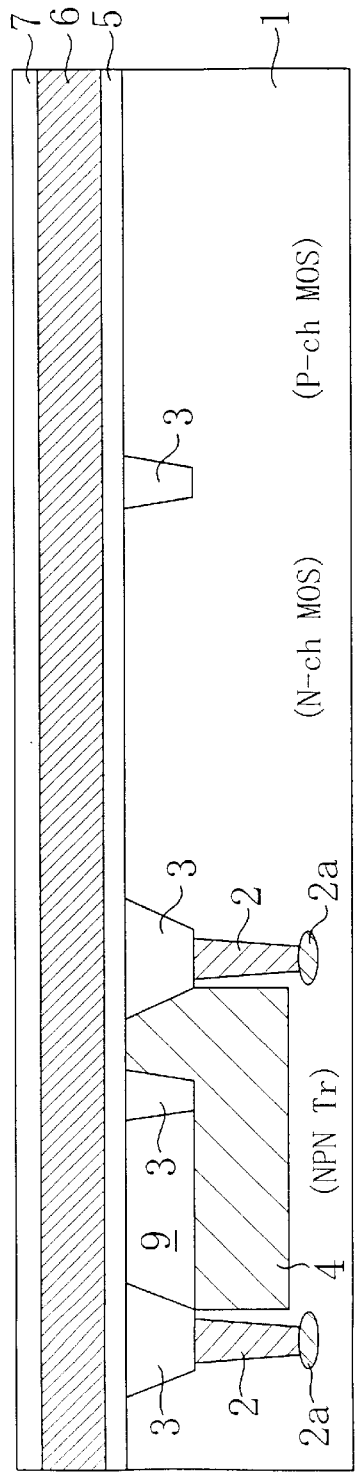
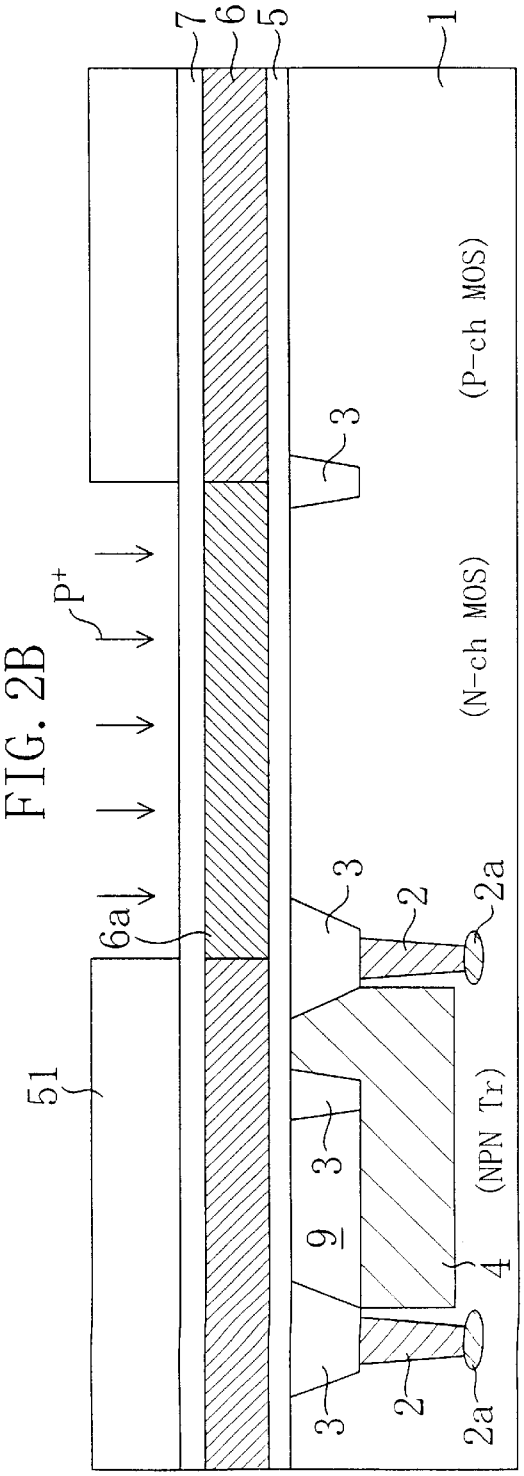

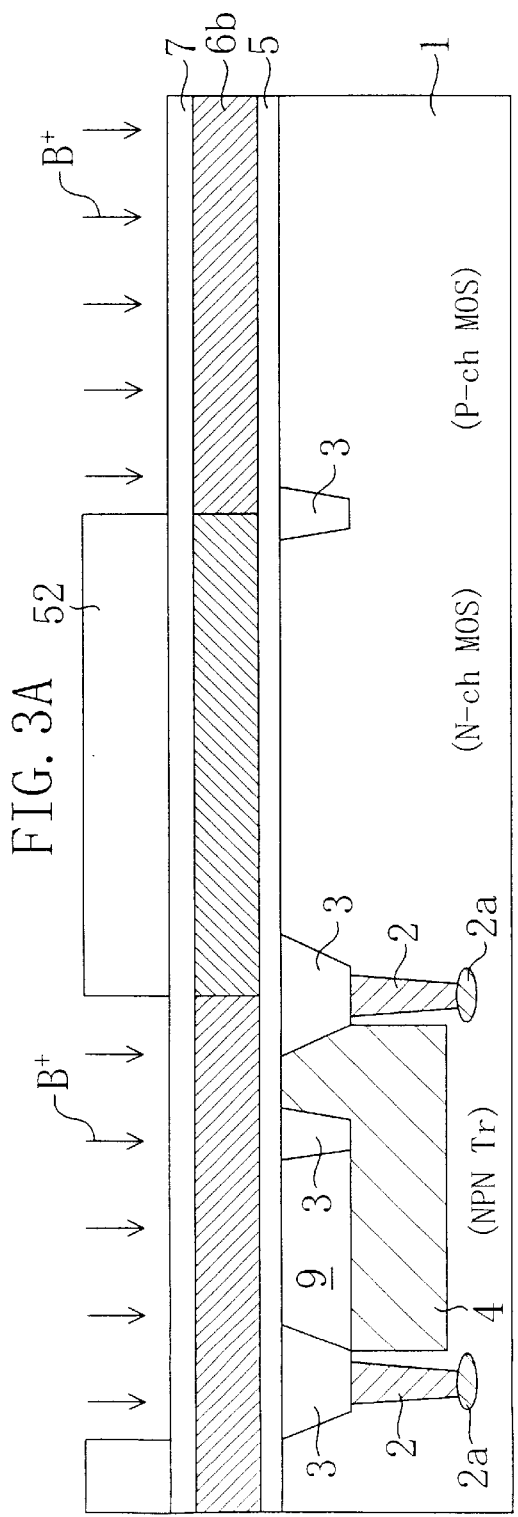
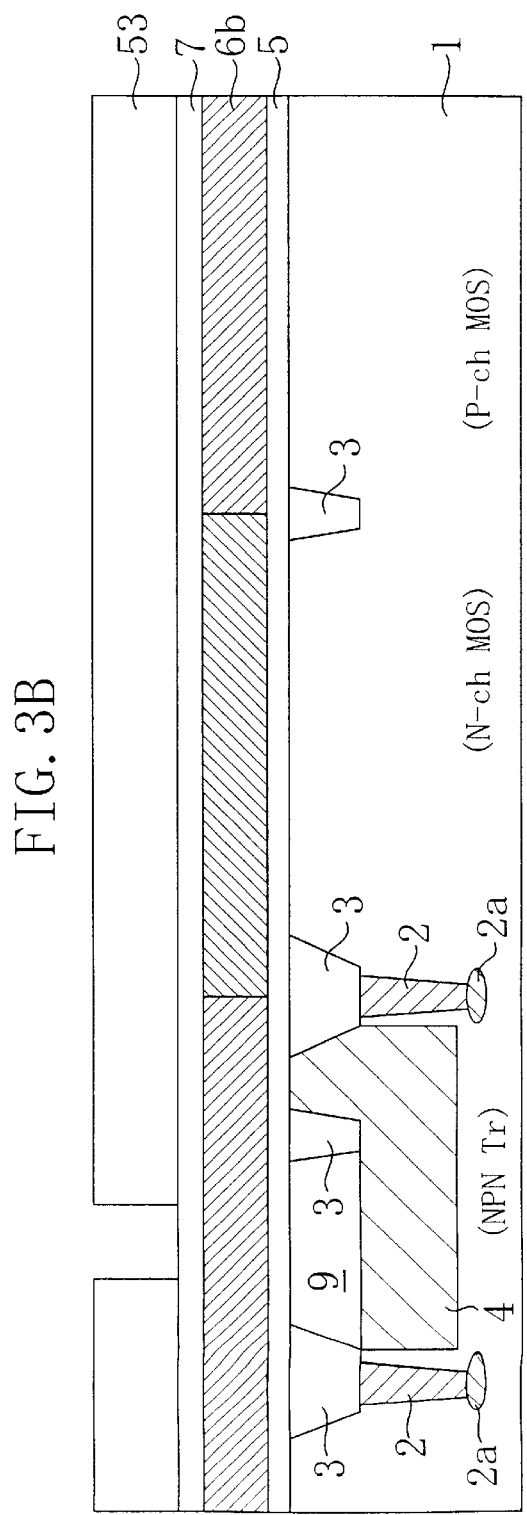

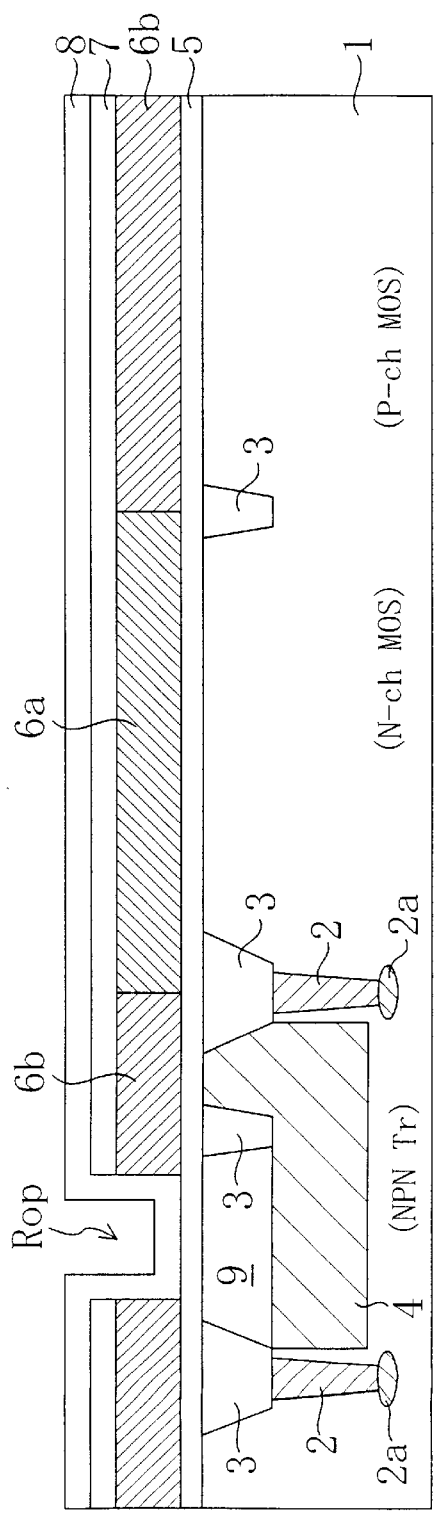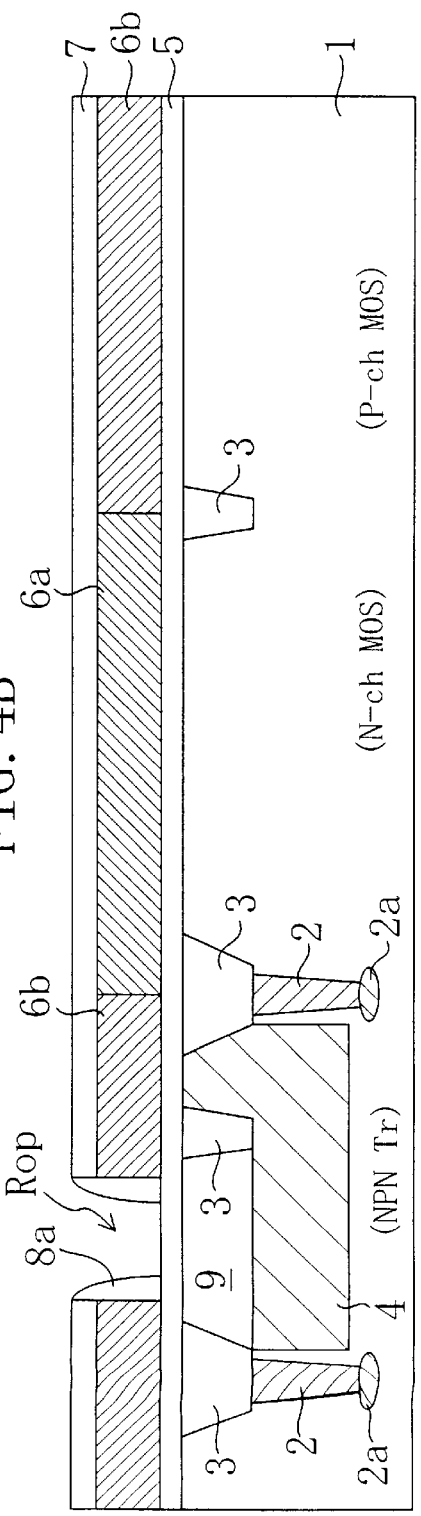

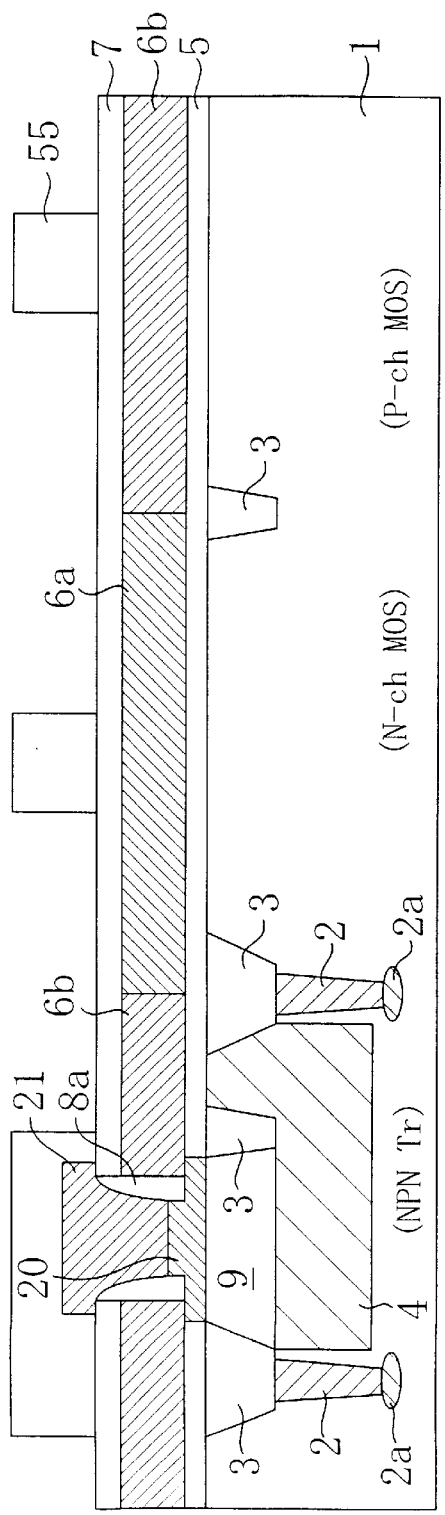
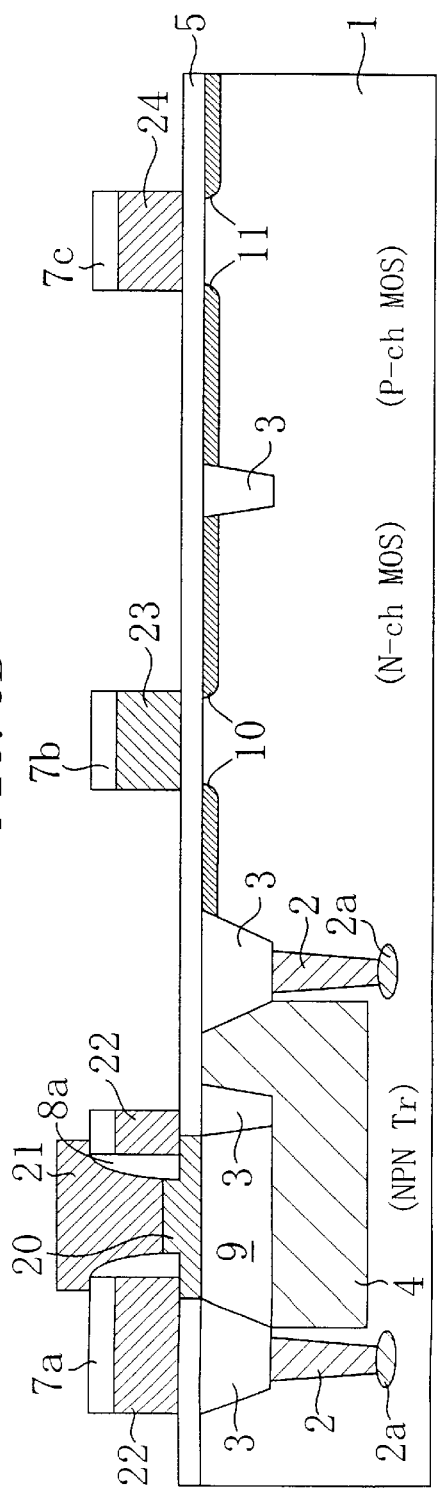

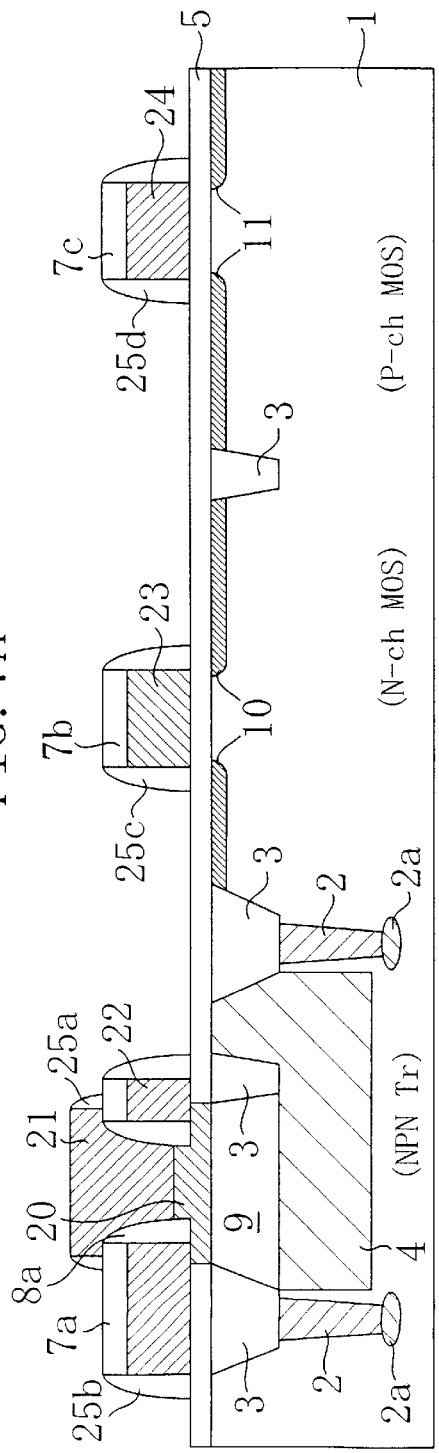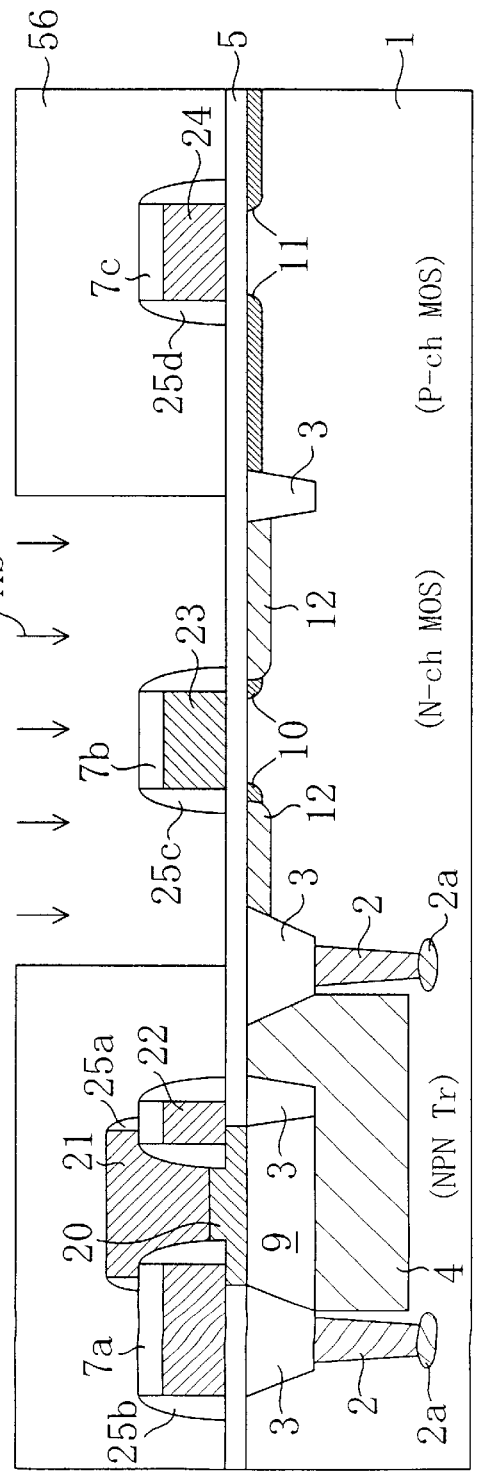

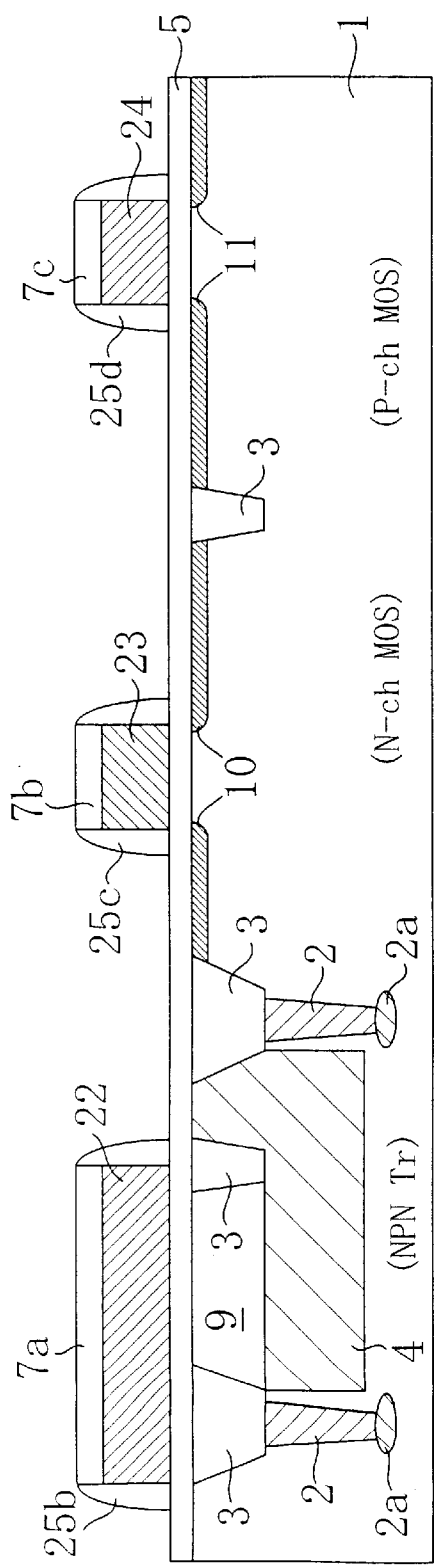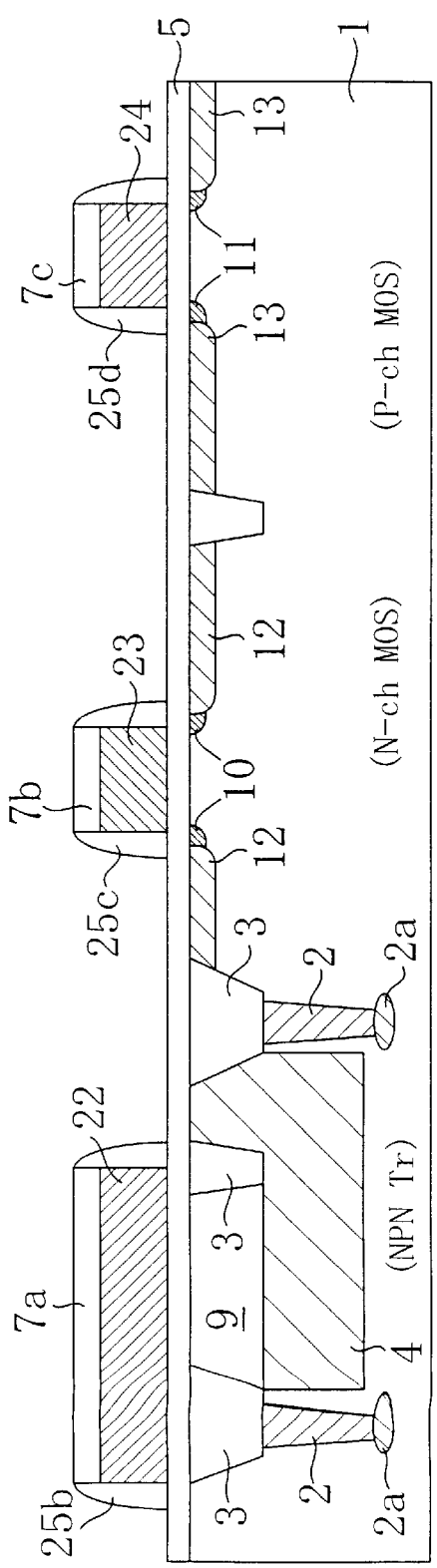

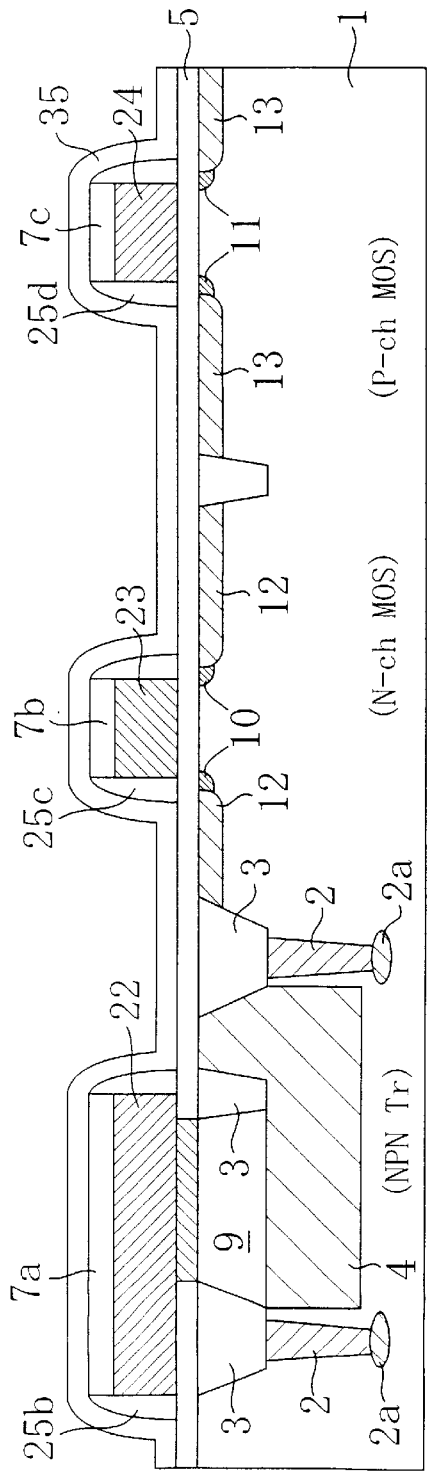
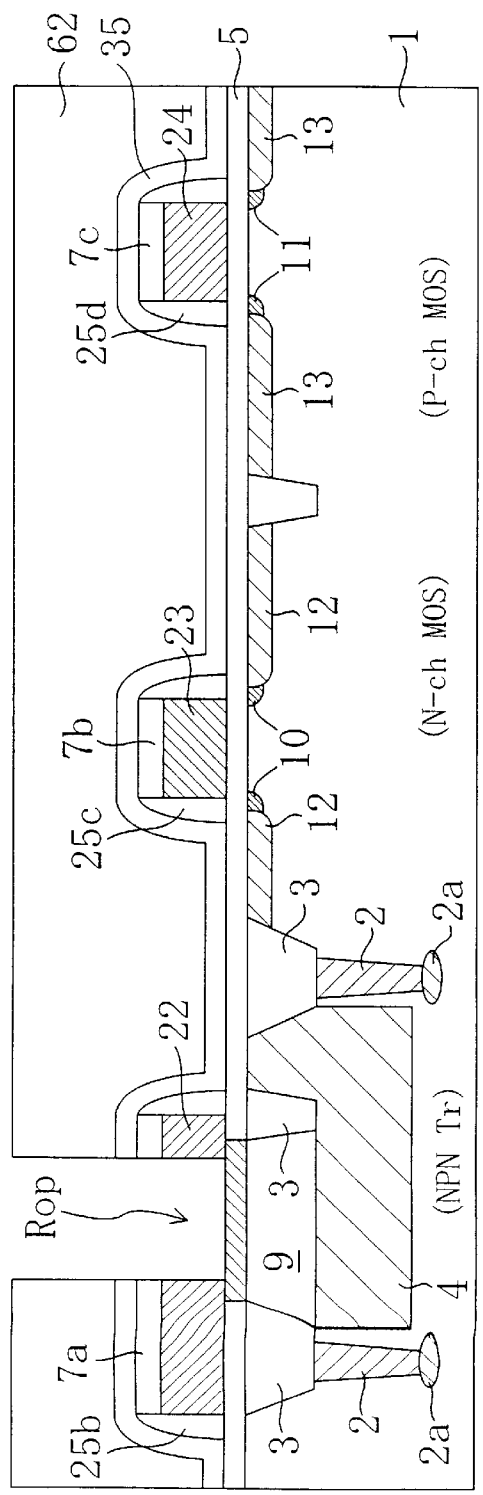

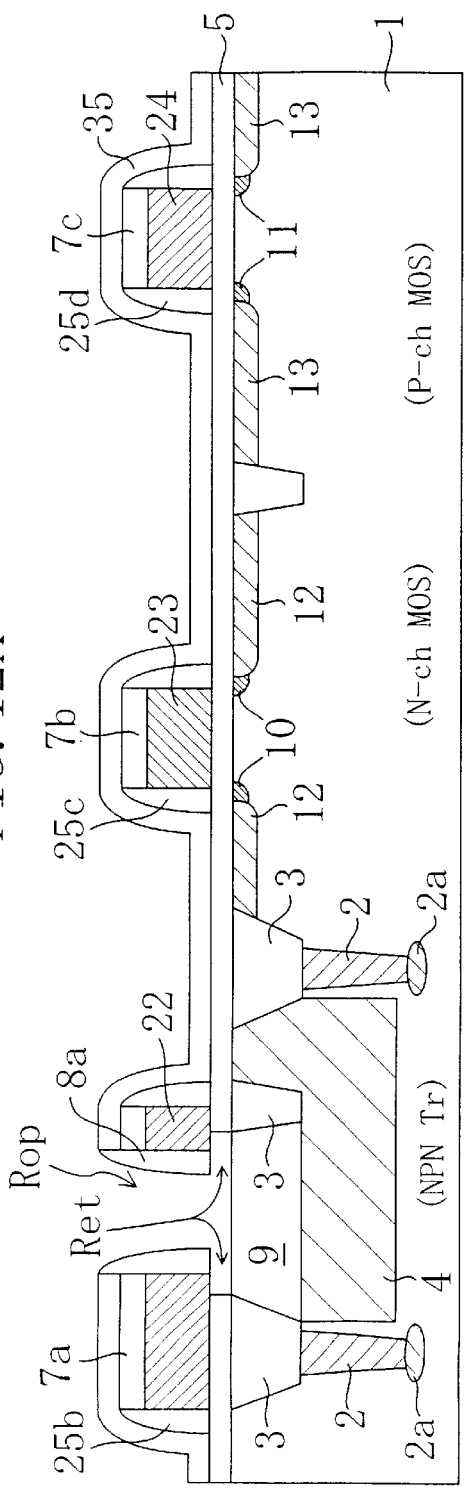
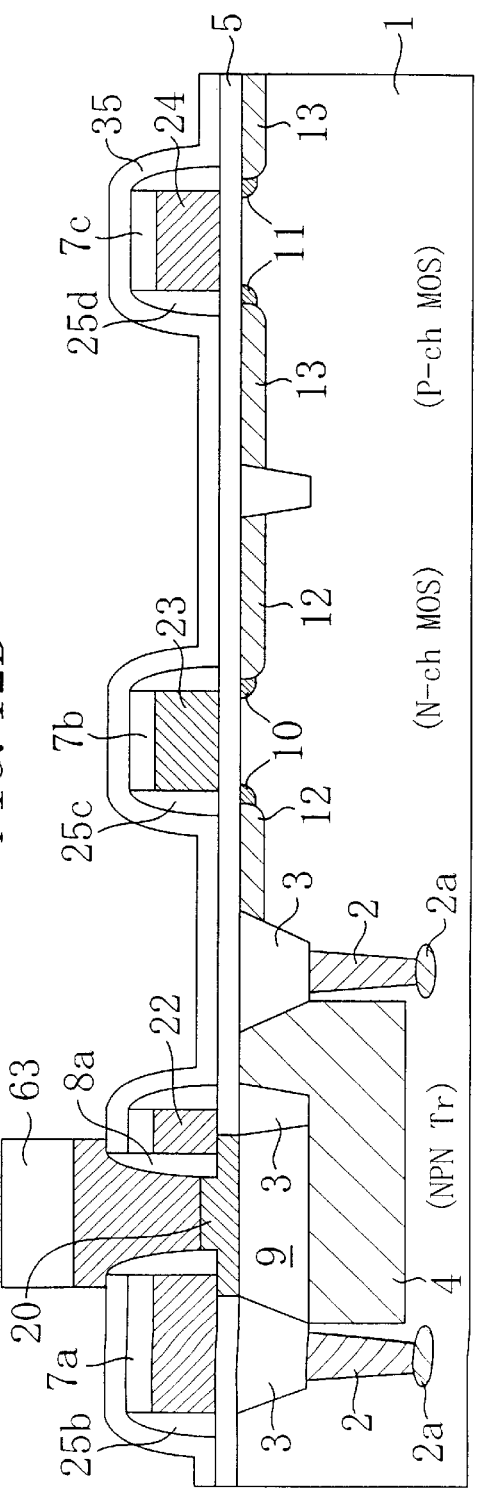

SEMICONDUCTOR DEVICE AND METHOD FOR FABRICATING THE SAME

TECHNICAL FIELD

The present invention relates to a method for fabricating a BiCMOS device: and a structure thereof, and more particularly relates to a BiCMOS device, in which a base layer is formed for a bipolar transistor by a selective epitaxial growth technique.

BACKGROUND ART

A bipolar transistor has been used as a circuit element with high-speed and high-current characteristics. Particularly, a type of high-performance bipolar transistor is called a "self-aligned base transistor", an example of which is disclosed in U.S. Pat. No. 4,319,932. According to a technique disclosed in this patent, by implanting a dopant through an implantation window, raised sub-collector, intrinsic base and emitter layers are formed.

Also, a technique of forming a heterojunction for enhancing the performance of a bipolar transistor is known. To form a heterojunction in a transistor with a silicon substrate for that purpose, a technique of using a material with a bandgap wider than that of Si for a base layer (e.g., GaP, SiC or amorphous Si grown on a base layer) and a technique of using a material with a narrow bandgap (e.g., SiGe compound semiconductor for a base; see Japanese Laid-Open Publication No. 6-77245) have been developed. Particularly, as a method for fabricating a bipolar transistor including a precisely controlled base layer by selective epitaxial growth, a method disclosed in Japanese Laid-Open Publication No. 8-83805, for example, is known. In this method, a silicon dioxide film with a thickness of about 140 nm as an insulator, and a polysilicon film for base extended electrode are stacked and then part of the polysilicon film, in which an emitter will be formed, is removed to form an opening. Then, part of the silicon dioxide film exposed on the bottom of the opening is isotropically etched to expose part of a silicon substrate and then a silicon film to be connected to crystalline silicon for a base and the polysilicon film for a base extended electrode is deposited on the part of the silicon substrate exposed inside the opening. A main object of this method is to reduce a junction leakage around a base layer and is also characterized in that the structure of a transistor can be downsized and parasitic capacitance and parasitic resistance can be reduced by utilizing the selective epitaxial growth technique.

Also, a so-called "BiCMOS device", including a bipolar transistor and CMOS transistors formed on the same semiconductor substrate, is well-known.

PROBLEMS TO BE SOLVED

However, where a base layer for a bipolar transistor is formed by the known selective epitaxial growth, the following problems arise.

Firstly, if an insulating film with a thickness (about 140 nm) greater than that of the base layer subjected to the selective epitaxial growth is used, problems often arise in terms of the yield and productivity. For example, the type of SiGe epitaxial growth (selective or non-selective growth) and the thickness of a $P^+$-type single crystal silicon layer to be electrically connected to the polysilicon for base extended electrode are difficult to control.

Also, a fabrication process for a BiCMOS device is performed with the characteristics of its CMOS block respected. However, if the fabricating method for a bipolar transistor utilizing the known selective epitaxial growth is applied to the fabrication process for a BiCMOS device as it is, the number of process steps and the fabrication cost increase significantly.

Furthermore, as the thickness of a base layer is further reduced in the future, adverse effects of undue stress should be brought about in an interface between dissimilar materials, e.g., an interface between the base layer, which is an epitaxially grown layer, and an insulating layer, due to a difference in thermal expansion coefficients.

In view of these problems, the present invention provides a method for fabricating a BiCMOS device including a heterojunction bipolar transistor that can be controlled under a fewer restrictions by utilizing a selective epitaxial growth technique. The present invention also provides a method for fabricating a BiCMOS device that can lessen the adverse effects of undue stress, which should be applied to the interface between dissimilar materials in the near future.

DISCLOSURE OF INVENTION

A semiconductor device according to the present invention includes: a substrate having a semiconductor layer at least in a surface region thereof; a collector layer of a first conductivity type, which is provided in the semiconductor layer; a base extended electrode, which is provided over the collector layer and is formed out of a conductor film with a first opening; a base undercoat insulating film, which is interposed between the substrate and the base extended electrode and has a second opening wider than the first opening; a base layer of a second conductivity type, which is provided on the semiconductor layer and includes a peripheral portion and a center portion, the peripheral portion being in contact with a lower edge of the base extended electrode around a periphery of the first opening, the center portion being located in an inner region of the first opening of the base extended electrode and deposited thicker than the peripheral portion; an emitter layer of the first conductivity type, which is provided inside the first opening of the base extended electrode and is in contact with the upper surface of the center portion of the base layer; and an insulator film interposed between a side face of the first opening of the base extended electrode and the base and emitter layers.

In this structure, the peripheral portion of the base layer is thinner than the center portion of the base layer, and a stress, resulting form a difference in thermal expansion coefficient between the base layer and base undercoat insulating film, can be reduced. Specifically, where the edge of a base layer is in direct contact with a base extended electrode in a known bipolar transistor, a base undercoat insulating film is thicker than the base layer, which needs to have a thickness between 50 nm and 100 nm ordinarily. Therefore, a great stress, resulting from a difference in thermal expansion coefficient between them, is applied to the base layer and so on. As a result, where a heterojunction is formed between the base and collector layers, the characteristic of the bipolar transistor might be degraded due to a relaxed strain. In contrast, in the present invention, by reducing the thickness of the base undercoat insulating film, the stress, resulting form the difference in thermal expansion coefficient between the base undercoat insulating film and base layer, can be reduced, thus suppressing the degradation in characteristic of the bipolar transistor.

The lower edge of the base extended electrode around the periphery of the first opening may be extended to be in contact with the collector layer along a side face of the second opening of the base undercoat insulating film. And the peripheral portion of the base layer may be separated from the base undercoat insulating film by the lower edge of the base extended electrode. As a result, the creation of the stress, resulting from the difference in thermal expansion coefficient, can be further suppressed.

The semiconductor layer may be made of Si single crystals. The base layer may be made of SiGe single crystals. The emitter layer may be made of Si single crystals. And the semiconductor device may be a heterojunction bipolar transistor.

Alternatively, the collector layer may be made of Si single crystals. The base layer may be made of SiGeC single crystals. And the emitter layer may be made of Si single crystals.

And the semiconductor device may be a heterojunction bipolar transistor. In such a case, by changing the composition of the SiGeC single crystals, the strain and the function of the bipolar transistor can be controlled appropriately and easily.

An MIS transistor, including a gate insulating film provided on the substrate and a gate electrode provided on the gate insulating film, may be formed on the substrate. And the base extended electrode of the bipolar transistor and the gate electrode of the MIS transistor may be formed out of the same conductor film. Then, the number of process steps can be cut down and the fabrication cost can be reduced.

An inventive semiconductor device fabricating method is used for fabricating a semiconductor device including a bipolar transistor that comprises: a collector layer of a first conductivity type, formed out of a first semiconductor layer; a base layer of a second conductivity type, formed out of a second semiconductor layer; an emitter layer of the first conductivity type, formed out of a third semiconductor layer; a base extended electrode formed out of a first conductor film; and an emitter extended electrode formed out of a second conductor film. The method includes the steps of: (a) forming a first insulator film on the first semiconductor layer existing at least in a surface region of a substrate; (b) forming the first conductor film on the first insulator film; (c) forming a first opening in the first conductor film to expose the first insulator film; (d) etching isotropically part of the first insulator film, which part is exposed inside the first opening, to form a second opening, which is wider than the first opening, in the first insulator film, thereby exposing the first semiconductor layer; (e) forming the second semiconductor layer, including a peripheral portion and a center portion, on the first semiconductor layer by an epitaxial growth process, the peripheral portion being in contact with a lower edge of the first conductor film around a periphery of the first opening, the center portion being located in an inner region of the first opening of the first conductor film and deposited thicker than the peripheral portion; (f) forming the third semiconductor layer on the second semiconductor layer; and (g) forming the second conductor film over the substrate after the step (f) has been performed.

In this method, the semiconductor device can be formed easily. Particularly, in the step (e), the first insulator film to be a base undercoat insulating film is thinner than the center portion of the base layer, and the second semiconductor layer can be easily grown epitaxially to come into contact with the lower edge of a first conductor film.

The method may further include the step of patterning the first conductor film to form the base extended electrode of the bipolar transistor and a gate electrode for an MIS transistor at a time. Then, a BiCMOS device can be formed in a fewer number of process steps.

The method may further include the step of removing an oxide film from an exposed part of the first conductor film by performing an annealing process in an ultra high vacuum between the steps (d) and (e), thereby making a part of the first conductor film, hanging from the lower edge thereof around the periphery of the first opening, come into contact with the first semiconductor layer. In this manner, the stress, resulting from the difference in thermal expansion coefficient between the second semiconductor layer and first insulator film, can be further reduced.

The first semiconductor layer may be an Si layer. A single crystal SiGe layer may be formed as the second semiconductor layer in the step (e). And a single crystal Si layer may be formed as the third semiconductor layer in the step (f). As a result, an Si/SiGe hetero bipolar transistor can be formed.

The first semiconductor layer may be an Si layer. A single crystal SiGeC layer may be formed as the second semiconductor layer in the step (e). And a single crystal Si layer may be formed as the third semiconductor layer in the step (f). Then, by controlling the composition of SiGeC single crystals in the step (e), the stress applied to the second semiconductor layer and the strain of the bipolar transistor can be controlled appropriately and easily.

BRIEF DESCRIPTION OF DRAWINGS

FIGS. 2(a) and 2(b) are cross-sectional views illustrating respective steps, which are carried out until phosphorus ions are implanted into a first polysilicon film, in a fabrication process for a BiCMOS device according to the first embodiment.

FIGS. 3(a) and 3(b) are cross-sectional views illustrating respective steps, in which boron ions are implanted into the first polysilicon film and then a resist pattern for forming a first opening is defined, in the fabrication process of the BiCMOS device of the first embodiment.

FIGS. 4(a) and 4(b) are cross-sectional views illustrating respective steps, in which the first opening is formed and then a nitride film sidewall is formed on the side faces of the first opening, in the fabrication process of the BiCMOS device of the first embodiment.

FIGS. 6(a) and 6(b) are cross-sectional views illustrating respective steps, in which a resist pattern for patterning the first polysilicon film is formed and then respective electrodes are formed, in the fabrication process of the BiCMOS device of the first embodiment.

FIGS. 7(a) and 7(b) are cross-sectional views illustrating respective steps, in which an oxide film sidewall is formed on the side faces of the respective electrodes and then heavily doped source/drain regions for an n-channel MOS transistor are formed, in the fabrication process of the BiCMOS device of the first embodiment.

FIGS. 10(a) and 10(b) are cross-sectional views illustrating respective steps, in which a nitride film sidewall is formed on the side faces of the respective electrodes and then heavily doped source/drain regions for respective MOS transistors are formed, in the fabrication process of the BiCMOS device of the second embodiment.

FIGS. 11(a) and 11(b) are cross-sectional views illustrating respective steps, in which an etch stopper oxide film is formed and then a first opening is formed, in the fabrication process of the BiCMOS device of the second embodiment.

FIGS. 12(a) and 12(b) are cross-sectional views illustrating respective steps, in which a second opening is formed and then an emitter extended electrode is formed, in the fabrication process of the BiCMOS device of the second embodiment.

BEST MODE FOR CARRYING OUT THE INVENTION

Hereinafter, a method for forming an NPN bipolar transistor and CMOS transistors according to embodiments of the present invention will be described with reference to the drawings.

Embodiment 1

Figure 1:
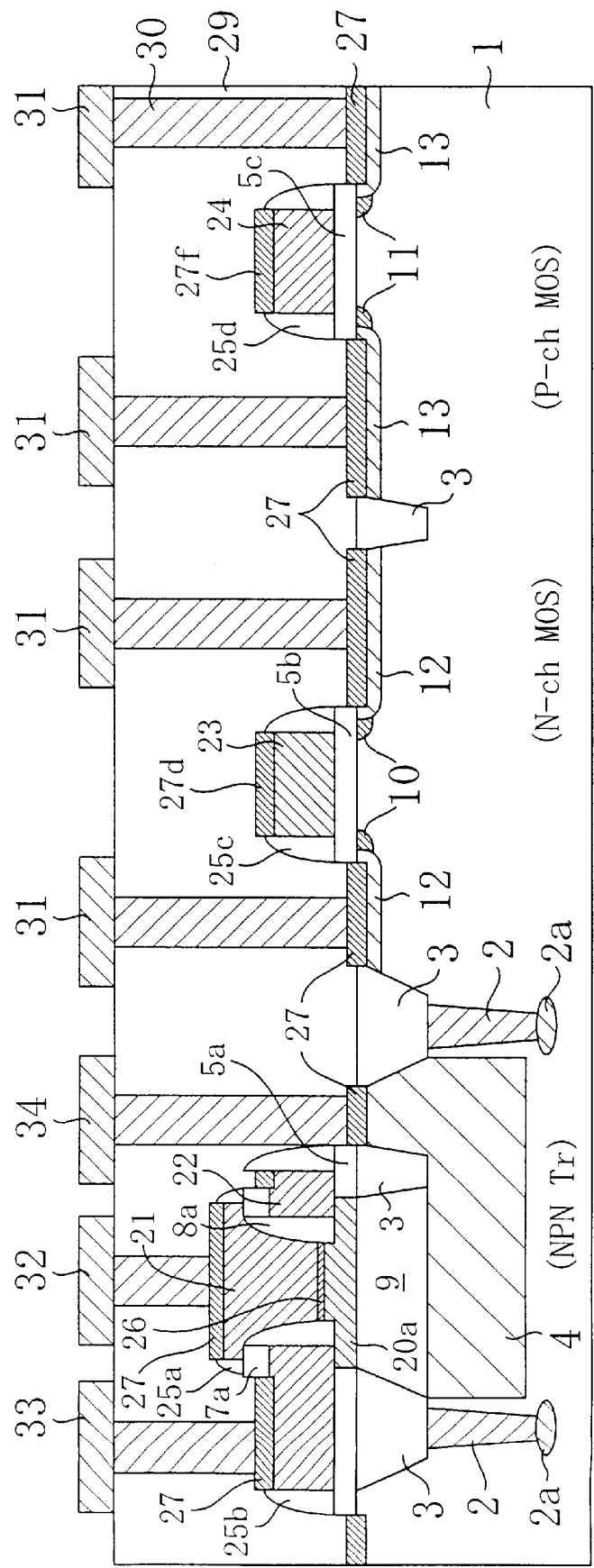
FIG. 1 is a cross-sectional view illustrating a structure for a bipolar transistor block and a CMOS block in a BiCMOS device according to a first embodiment of the present invention.

FIG. 1 is a cross-sectional view illustrating a structure for a bipolar transistor block and a CMOS block in a BiCMOS device according to this embodiment. As shown in FIG. 1, in deeper parts of a silicon substrate 1, deep trench isolations 2, surrounding the periphery of a bipolar transistor, and channel stoppers 2a, formed under the trench isolations 2, are provided. These deep trench isolations 2 are formed by cutting trenches that are deeper than a well region (not shown) of the silicon substrate 1, depositing a silicon dioxide film over the entire surface of the trenches and then filling the trenches with polysilicon. These deep trench isolations 2 electrically isolate bipolar transistors from each other and the bipolar transistor block from the CMOS block. And on the upper surface of the deep trench isolations 2, shallow trench isolations 3 are provided.

In the bipolar transistor block, a region, surrounded by the deep trench isolations 2 and shallow trench isolations 3 formed thereon in the silicon substrate 1, is a collector region for an NPN transistor. In addition, another shallow trench isolation 3, dividing the collector region in the silicon substrate 1 into two, is also provided. This shallow trench isolation 3 is formed by filling a trench shallower than the collector region with a silicon dioxide film and has a function of reducing parasitic capacitance between base and collector as much as possible. As for the CMOS block, on the other hand, no deep trench isolations 2 exist but only the shallow trench isolations 3, electrically isolating respective MOS transistors from each other, are provided.

In the bipolar transistor block, the collector region is divided into a sub-collector layer 4 and a collector diffused layer 9 by the shallow trench isolation 3. And over the collector diffused layer 9, a base layer 20a made of SiGe single crystals and an emitter layer 26 made of almost 100% of Si single crystals are stacked in this order. The base layer 20a has a so-called "gradient composition", in which the Ge mole fraction changes almost continuously, so that its Ge mole fraction is about 15% ($Si_{0.85}Ge_{0.15}$) in the vicinity of the interface with the collector diffused layer 9 and almost 0% in the vicinity of the interface with the emitter layer 26. And the emitter layer 26 essentially consists of single crystal Si. Further, over the periphery of the base layer 20a, base extended electrodes 22 of boron-doped polysilicon are provided. A base undercoat insulating film 5a of a silicon dioxide film is interposed between the base extended electrodes 22 and the silicon substrate 1. On the other hand, an emitter extended electrode 21 of phosphorus-doped polysilicon is provided on the emitter layer 26. A nitride film sidewall 8a and an on-base passivation film 7a are interposed between the emitter and base extended electrodes 21 and 22. Oxide film sidewalls 25a and 25b are formed on the side faces of the emitter extended electrode 21 and on the outer side faces of the base extended electrodes 22, respectively. Also, on the surfaces of the base extended electrodes 22, emitter extended electrode 21 and sub-collector layer 4, a titanium silicide layer 27 is deposited. Also, emitter, base and collector interconnects 32, 33 and 34 made of an aluminum alloy film are formed on an interlevel dielectric film 29 covering the entire substrate. The interconnects 32, 33 and 34 and the titanium silicide layer 27, formed on these members, are connected together via contacts 30 passing through the interlevel dielectric film 29.

On the other hand, as for the CMOS block, no deep trench isolations 2 exist but only the shallow trench isolations 3 for electrically isolating the MOS transistors from each other are provided. In the CMOS block, gate insulating films 5a and 5b of a silicon dioxide film and gate electrodes 23 and 24 are stacked in this order over the silicon substrate 1 for n-channel and p-channel MOS transistors. On the side faces of the gate electrodes 23 and 24, oxide film sidewalls 25c and 25d are formed, respectively. Lightly doped source/drain regions (LDD regions) 10 and 11 and heavily doped source/drain regions 12 and 13 are provided in parts of the silicon substrate 1, located on both sides of the gate electrodes 23 and 24, respectively. The titanium silicide layer 27 is deposited on the surfaces of the gate electrodes 23 and 24 and heavily doped source/drain regions 12 and 13. Further, interconnects 31 of the aluminum alloy film are formed on the interlevel dielectric film 29 covering the entire substrate. The interconnects 31 and the titanium silicide layer 27 formed on these members are connected together via the contacts 30 passing through the interlevel dielectric film 29. It should be noted that parts of the titanium silicide layer 27 on the gate electrodes 23 and 24 are also connected to different interconnects from the interconnects 31 although not appearing in the cross section illustrated in FIG. 1.

FIGS. 2(a) through 8 are cross-sectional views illustrating respective process steps for fabricating the NPN bipolar transistor and CMOS transistors according to this embodiment.

First, in the process step shown in FIG. 2(a), trench isolations 2 and 3 are formed in a silicon substrate by filling trenches with a silicon dioxide film and polysilicon. To create this state, parts of the silicon substrate 1, in which isolation regions will be defined, may be removed to form trenches and then the trenches may be filled with a silicon dioxide film, thereby forming shallow trench isolations 3. Thereafter, a silicon nitride film is deposited over the substrate and then parts of the silicon nitride film, in which deep trench isolations will be defined, are removed to form trench opening windows. The trench opening windows are located in the vicinity of the center of the shallow trench isolations 3. Then, parts of the silicon substrate 1, located under the trench opening windows, are etched away using the silicon nitride film as a mask, thereby forming deep trenches passing through the shallow trench isolations 3 and reaching parts of the substrate thereunder. Further, boron ions are implanted using the silicon nitride film as a mask, thereby forming a channel stopper layer 3a, and then parts of the substrate exposed in the deep trenches are oxidized to form a trench sidewall oxide film. Subsequently, a polysilicon film is deposited over the substrate and then etched back by a dry etching process, thereby forming a buried polysilicon layer inside the deep trenches. The deep trench isolations 2 are made up of the buried polysilicon layer and trench sidewall oxide film. Next, by oxidizing the buried polysilicon layer in the deep trench isolations 2, a silicon dioxide film is formed again on the recesses that were formed inside the shallow trench isolations 3 when the deep trenches were formed.

In this process step, a concentration of an n-type dopant, e.g., phosphorus, in a collector diffused layer 9 is about $1 \times 10^{17}$ cm$^{-3}$. On the other hand, a concentration of the n-type dopant in a sub-collector layer 4 is about $1 \times 10^{19}$ cm$^{-3}$, which is higher compared to the collector diffused layer 9. The sub-collector layer 4 can be formed by epitaxially growing a silicon layer on a heavily doped layer. Also, in the CMOS block, a p-well and an n-well are formed in parts of the silicon substrate 1, in which n-channel and p-channel MOS transistors will be formed, respectively, although not shown. Furthermore, a dopant for setting the threshold voltage is introduced into the p-well and n-well. These process steps are carried out by using ion implantation technique and annealing technique that have been well-known and widely used.

Subsequently, by treating the surface of the silicon 5 substrate 1 with a chemical solution such as hydrofluoric acid, the oxide film, existing on the regions where respective transistors will be formed, is removed, thereby exposing the surface of the substrate, on which these transistors will be formed. Thereafter, a first insulating film 5 of a silicon dioxide film is deposited to a thickness of about 7 nm over the substrate by a thermal oxidation process. Further, a first polysilicon film 6 (a first conductor film) with a thickness of about 150 nm and a passivation film 7 with a thickness of about 50 nm are stacked over the first insulating film 5 by an LPCVD process. In this case, the first insulating film 5 preferably has a thickness of 10 nm or less. This is because, in the BiCMOS structure, a film with the same thickness as a gate insulating film for the resultant MIS transistors has only to be deposited in a single process 20 step, and stress applied to a base layer 20a to be formed later can be reduced in that case.

Next, in the process step shown in FIG. 2(b), a resist pattern 51, which has an opening over a region where an n-channel MOS transistor will be formed, is defined on the passivation film 7. Thereafter, phosphorus ions (P$^+$) are implanted as an n-type dopant into the first polysilicon film 6 using this resist pattern 51 as a mask. As a result, part of the first polysilicon film 6, in which an n-channel MOS transistor will be formed, becomes an n-type polysilicon film 6a.

Subsequently, in the process step shown in FIG. 3(a), the resist pattern 51 is stripped and then a resist pattern 52, which has an opening over a region where a p-channel MOS transistor will be formed, is defined on the passivation film 7. Thereafter, boron ions (B$^+$) are implanted as a p-type dopant into the first polysilicon film 6 using this resist pattern 52 as a mask. As a result, part of the first polysilicon film 6, in which a p-channel MOS transistor will be formed, becomes a p-type polysilicon film 6b. Thereafter, the resist pattern 52 is stripped and then an annealing process is performed at 900° C. for about 15 minutes to diffuse and introduce phosphorus and boron into the n-type and p-type polysilicon films 6a and 6b, respectively, at a concentration of about $5 \times 10^{20}$ cm$^{-3}$.

Next, in the process step shown in FIG. 3(b), a resist pattern 53, which has an opening over a region where a base will be formed for an NPN transistor, is defined on the passivation film 7. And in the process step shown in FIG. 4(a), the passivation film 7 and p-type polysilicon film 6b are dry-etched and patterned in this order using the resist pattern 53 as a mask to form a first opening Rop in parts of the passivation film 7 and p-type polysilicon film 6b where base and emitter will be formed. Thereafter, a silicon nitride film 8 is deposited to a thickness of about 120 nm over the substrate by a CVD process.

Next, in the process step shown in FIG. 4(b), the silicon nitride film 8 is etched anisotropically by a dry etching technique, thereby forming a nitride film sidewall 8a on the side faces of the passivation film 7 and p-type polysilicon film 6b inside the first opening Rop in the region where an NPN bipolar transistor will be formed.

Figure 5A:
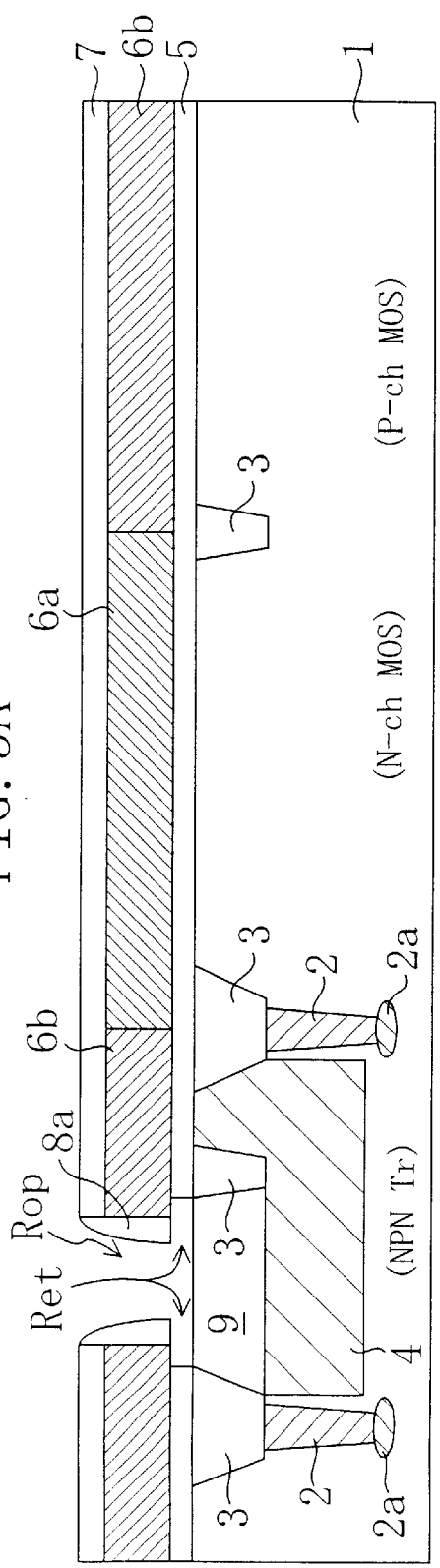
FIGS. 5(a) and 5(b) are cross-sectional views illustrating respective steps, in which a second opening is formed and then an emitter extended electrode is formed, in the fabrication process of the BiCMOS device of the first embodiment.

Subsequently, in the process step shown in FIG. 5(a), a wet etching process is performed using a process solution such as hydrofluoric acid to remove the silicon dioxide film. In this process step, a portion of the first insulating film 5 is removed to form a second opening Ret in the first insulating film 7. The removed portion of the first insulating film 5 includes part exposed inside the first opening Rop, part located under the nitride film sidewall 8a and part located under the p-type polysilicon film 6b. It should be noted that the passivation film 7 is also etched when the first insulating film 5 is etched with hydrofluoric acid. Therefore, the difference in etch rate between the first insulating film 5 and passivation film 7 and the thickness of the passivation film 7 to be left in the state shown in FIG. 5(b) should be taken into consideration to determine the thickness of the passivation film 7 appropriately.

Figure 5B:
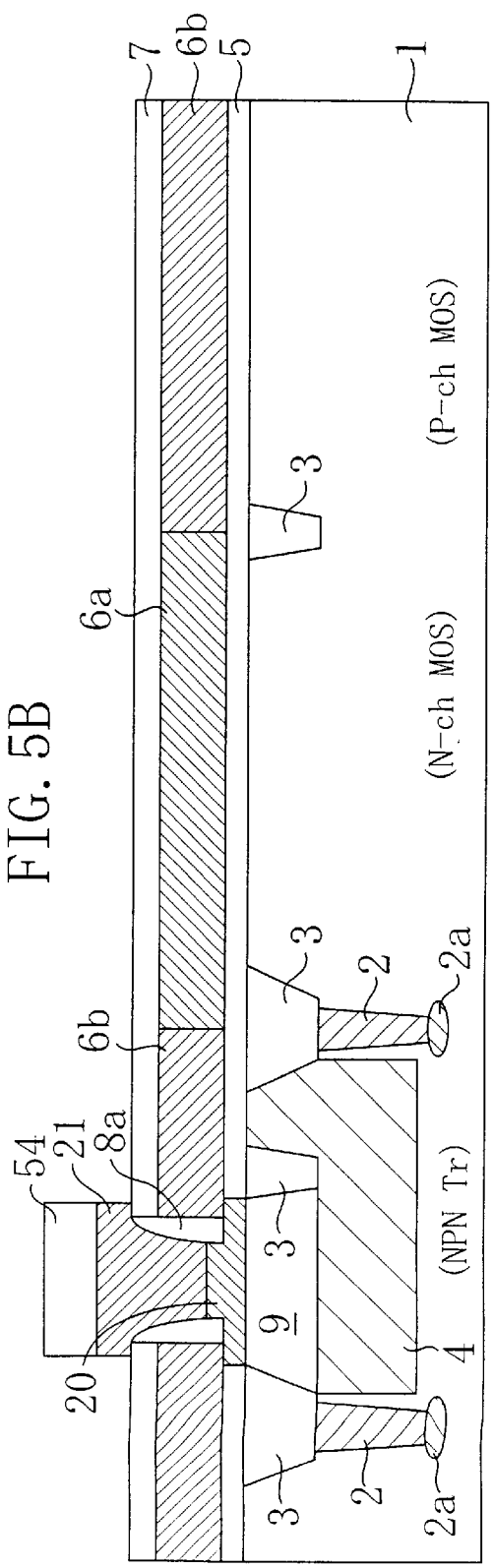

Next, in the process step shown in FIG. 5(b), a boron-doped single crystal SiGe layer 20 with a thickness between 50 nm and 100 nm is formed on the silicon substrate 1 inside the first and second openings Rop and Ret by a UHV-CVD technique. Specifically, a mixture of disilane, germane and diborane gases is introduced into a chamber of a CVD apparatus and the temperature and vacuum inside the chamber are kept at about 550° C. and at $1\times10^{-3}$ Torr (0.13 Pa), respectively. In this process step, the epitaxial growth is carried out under such conditions that the Ge mole fraction of the SiGe layer 20 is 15% ($Si_{0.85}Ge_{0.15}$) initially and then decreases almost continuously to reach almost 0% when the epitaxial growth is finished. In this process step, the vacuum inside the chamber may be reduced by the UHV-CVD technique and the epitaxial growth rate may be controlled by the surface reaction. In this manner, the SiGe layer 20 can easily be deposited only on the surface of the silicon substrate 1, not on the surfaces of the oxide and nitride films, thus realizing the intended selective epitaxial growth. As a result, the SiGe layer 20 is formed only inside the first and second openings Rop and Ret in the region where an NPN transistor will be formed, while no SiGe layer is deposited on the surfaces of the oxide and nitride films existing in other regions. And the upper surface of the SiGe layer 20 at the ends is in contact with the lower surface of the p-type polysilicon film 6b around the periphery of the first opening Rop. It is noted that a polycrystalline SiGe layer might be deposited slightly on the lower surface of the p-type polysilicon film 6b, which is exposed inside the second opening Ret and is in the periphery of the first opening Rop.

Next, in order to provide an emitter-base junction in Si single crystals, a single crystal Si layer is epitaxially grown on the SiGe base layer.

It should be noted that another SiGe layer, which does not have a gradient composition but has a constant composition and is not doped with boron, may be formed under the base layer to provide a base-collector junction in the SiGe layer.

Thereafter, a natural oxide film, formed on the surface of the SiGe layer 20, is removed with hydrofluoric acid. Then, a second polysilicon film (a second conductor film) doped with arsenic (As) is deposited to a thickness of about 200 nm over the substrate under such conditions that the deposition of an oxide film is suppressed. In this case, the concentration of arsenic is about $5\times10^{20}/cm^3$. Further, a resist pattern 54, covering only a region where an emitter extended electrode will be formed, is defined on the second polysilicon film. Subsequently, the second polysilicon film is dryetched and patterned using the passivation film 7 as an etch stopper and being masked with the resist pattern 54, thereby forming an emitter extended electrode 21.

Next, in the process step shown in FIG. 6(a), a resist pattern 55, covering regions where base extended electrodes will be formed for an NPN transistor and regions where gate electrodes will be formed for transistors in the CMOS block, is defined over the substrate. Thereafter, in the process step shown in FIG. 6(b), the passivation film 7, n-type polysilicon film 6a and p-type polysilicon film 6b are patterned by a dry etching process using the resist pattern 55 as a mask. In this manner, base extended electrodes 22 and an on-base passivation film 7a are formed for an NPN bipolar transistor. A gate electrode 23 and an on-gate passivation film 7b are formed for an n-channel MOS transistor. And a gate electrode 24 and an on-gate passivation film 7c are formed for a p-channel MOS transistor. Subsequently, a resist pattern (not shown), covering the NPN bipolar transistor block and a region where a p-channel MOS transistor will be formed, is defined over the substrate. Thereafter, phosphorus ions ($P^+$) are implanted into the silicon substrate 1 using this resist pattern and the gate electrode 23 as a mask, thereby forming lightly doped source/drain regions 10 (LDD regions) for an n-channel MOS transistor. Further, a resist pattern (not shown), covering the NPN bipolar transistor block and a region where an n-channel MOS transistor will be formed, is defined over the substrate. Thereafter, boron fluoride ions ($BF_2^+$) are implanted into the silicon substrate 1 using this resist pattern and the gate electrode 24 as a mask, thereby forming lightly doped source/drain regions 11 (LDD regions) for a p-channel MOS transistor.

Next, in the process step shown in FIG. 7(a), a silicon dioxide film is deposited to a thickness of about 120 nm over the substrate. Then, the silicon dioxide film is etched anisotropically by a dry etching technique, thereby forming oxide film sidewalls 25a, 25b, 25c and 25d on the side faces of the emitter extended electrode 21, base extended electrodes 22 and gate electrodes 23 and 24, respectively.

Subsequently, in the process step shown in FIG. 7(b), a resist pattern 56, covering the NPN bipolar transistor block and the region where a p-channel MOS transistor will be formed, is defined over the substrate. Thereafter, arsenic ions ($As^+$) are implanted into the silicon substrate 1 using this resist pattern 56, gate electrode 23 and oxide film sidewall 25c as a mask, thereby forming heavily doped source/drain regions 12 for an n-channel MOS transistor.

Figure 8:
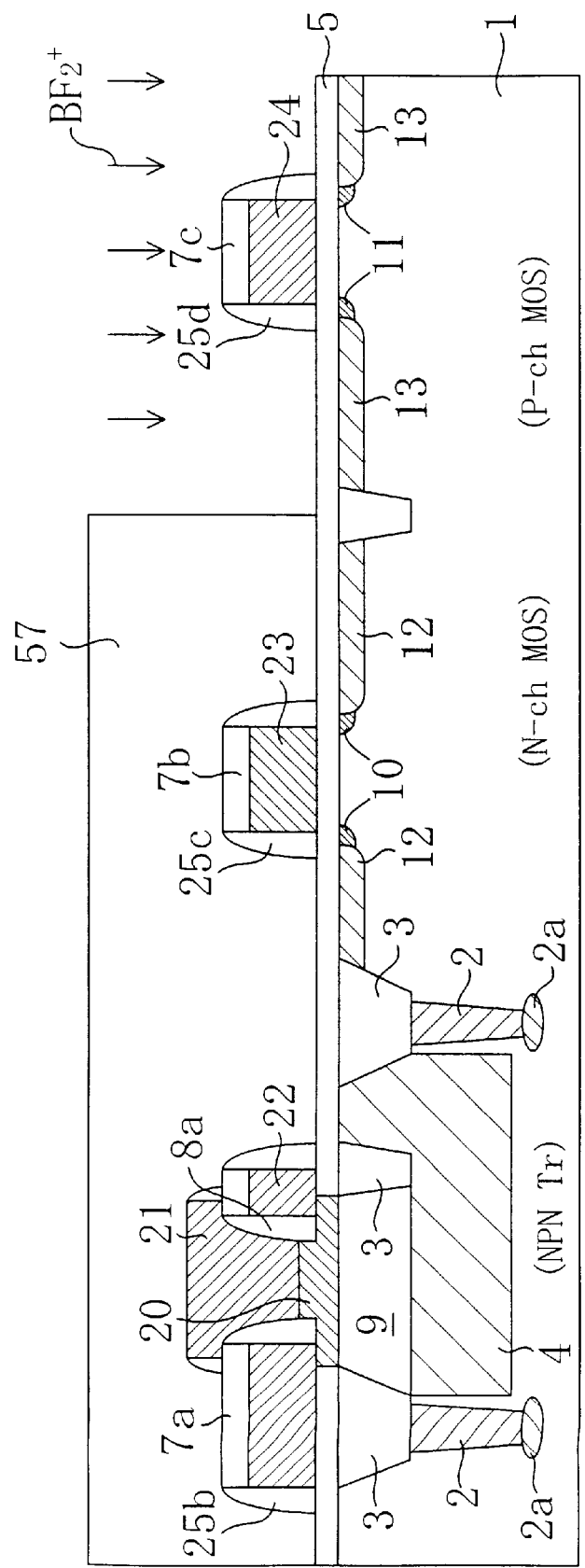
FIG. 8 is a cross-sectional view illustrating a process step, in which heavily doped source/drain regions for a p-channel MOS transistor are formed, in the fabrication process of the BiCMOS device of the first embodiment.

Next, in the process step shown in FIG. 8, a resist pattern 57, covering the NPN bipolar transistor block and the region where an n-channel MOS transistor will be formed, is defined over the substrate. Thereafter, boron fluoride ions ($BF_2^+$) are implanted into the silicon substrate 1 using this resist pattern 57, gate electrode 24 and oxide film sidewall 25d as a mask, thereby forming heavily doped source/drain regions 13 for a p-channel MOS transistor.

Succeeding process steps are not shown in the drawings. By carrying out the following process steps, the structure of the BiCMOS device shown in FIG. 1 is implemented.

First, an annealing process is performed at 1000° C. for about 10 seconds by an RTA technique to activate the dopant ions implanted. In this manner, the lightly doped source/drain regions 10 and 11 and heavily doped source/drain regions 12 and 13 are defined for the respective MOS transistors. Further, arsenic (As) as an n-type dopant is diffused from the emitter extended electrode 21 of the NPN bipolar transistor into the SiGe layer, thereby forming an emitter layer 26 in part of the SiGe layer 20, in which the Si mole fraction was almost 100%. And the remaining part of the SiGe layer 20, other than that part changed into the emitter layer 26, becomes a base layer 20a.

Thereafter, the surface of the substrate is treated with a solution such as hydrofluoric acid to remove an oxide film formed over the polysilicon film and silicon film. Then, metal titanium with a thickness of about 30 nm is deposited over the substrate by a sputtering technique. Furthermore, an annealing process is performed at about 650° C. for about 30 seconds to cause a silicidation reaction between polysilicon and titanium by utilizing a RTA process. As a result, a titanium silicide layer 27 is formed on the surfaces of the base and emitter extended electrodes 22 and 21 and subcollector layer 4 of the NPN bipolar transistor and on the surfaces of the gate electrodes 23 and 24 and heavily doped source/drain regions 12 and 13 of the CMOS block. It should be noted that the first insulating film 5 is divided into a base undercoat insulating film 5a and gate insulating films 5b and 5c before the silicidation process.

Next, unreacted parts of the metal titanium remaining on the silicon dioxide film are removed with a mixture of sulfuric acid and hydrogen peroxide water. Subsequently, an annealing process is performed at about 850° C. for about 10 seconds by utilizing an RTA technique to change the titanium silicide layer 27 into low-resistance crystals. Thereafter, an interlevel dielectric film 29 of a BPSG film with a thickness of about 2000 nm is deposited over the substrate by an atmospheric pressure CVD method. Then, contact holes, reaching the base extended electrodes 22, emitter extended electrode 21, sub-collector layer 4, gate electrodes 23 and 24 and heavily doped source/drain regions 12 and 13, are formed in the interlevel dielectric film 29. Further, an aluminum alloy film is deposited over the substrate by a sputtering process. Subsequently, the aluminum alloy film is patterned by photolithographic and dry etching techniques, thereby forming emitter, base and collector interconnects 32, 33 and 34 for an NPN bipolar transistor, interconnects 31 for MOS transistors and contacts 30 for electrically connecting these interconnects to the associated regions in the silicon substrate or electrodes.

According to this embodiment, the second polysilicon film is doped with arsenic in situ when the emitter extended electrode 21 is formed. Alternatively, the second polysilicon film may be deposited first, and then doped with arsenic ions. optionally, the SiGe layer 20 and phosphorus-doped silicon layer may be epitaxially grown sequentially to form the emitter extended electrode. The composition of the SiGe layer 20 is $Si_{0.85}Ge_{0.15}$ in the interface with the collector diffused layer 9. Alternatively, the SiGe layer 20 may have any other composition in accordance with the characteristic required for the NPN bipolar transistor.

Naturally, the size of the sidewalls 25c and 25d provided for CMOS transistors is a parameter that should be adjusted so as to realize a desired device characteristic.

As described above, according to the fabricating method of this embodiment, the first insulating film 5 for a gate insulating film and first polysilicon film 6 for forming gate electrodes for respective transistors in the CMOS block are used to form base layer 20a and base extended electrodes 22 for an NPN transistor, respectively. Accordingly, by performing some process steps in common for forming the CMOS and bipolar transistor blocks, the number of steps of the BiCMOS process can be reduced.

Moreover, in the method for fabricating a BiCMOS device according to this embodiment, the first insulating film 5 with a small thickness of about 7 nm is used in common as the base undercoat insulating film 5a for forming the second opening Ret where a base layer of the NPN transistor block will be formed and the gate insulating films 5b and 5c of the CMOS block. As a result, when the thickness of the base layer 20a should be reduced in order to enhance the performance of a bipolar transistor, the base layer 20a can be connected easily to the base extended electrodes 22, thereby increasing the productivity and throughput without going through known complicated process steps.

Further, where the base layer 20a is selectively and epitaxially grown by a UHV-CVD process, the greater the thickness of the layer, the harder it is to realize the selective epitaxial growth. And if the thickness reaches about 100 nm, the selective epitaxial growth is not be realized. Accordingly, a structure like that of this embodiment, in which the base layer 20a can easily make contact with the base extended electrodes 22 even if the base layer 20a is thin, is advantageous.

On the other hand, in the BiCMOS device formed by the fabricating method of this embodiment, the base layer 20a is in contact with the first insulating film 5 having a different thermal expansion coefficient, and a stress is created in the interface between them. However, the first insulating film 5 is as thin as about 7 nm, and the stress created is not so great as to affect the characteristic of the element seriously.

It is hard to evaluate the effects of stress strictly but stress relates to the volume of crystals and the area where dissimilar substances are in contact. So the smaller the element, the smaller the contact area between dissimilar substances should be. For that reason, the thickness of the first insulating film 5 is preferably 10 nm or less. However, if the first insulating film 5 is too thin, it is hard to etch part of the first insulating film 5 for the opening Ret with hydrofluoric acid. Accordingly, the thickness of the first insulating film 5 is preferably 3 nm or more.

It is noted that the base undercoat insulating film 5a for an NPN bipolar transistor and gate insulating films 5b and 5c for MOS transistors do not have to be formed out of a single silicon dioxide film (the first insulating film 5 in this embodiment), but may be different in thickness.

Embodiment 2

Next, a second embodiment will be described. FIGS. 9(a) through 11(b) are cross sectional views illustrating respective process steps for fabricating a BiCMOS device according to this embodiment.

Figure 9A:
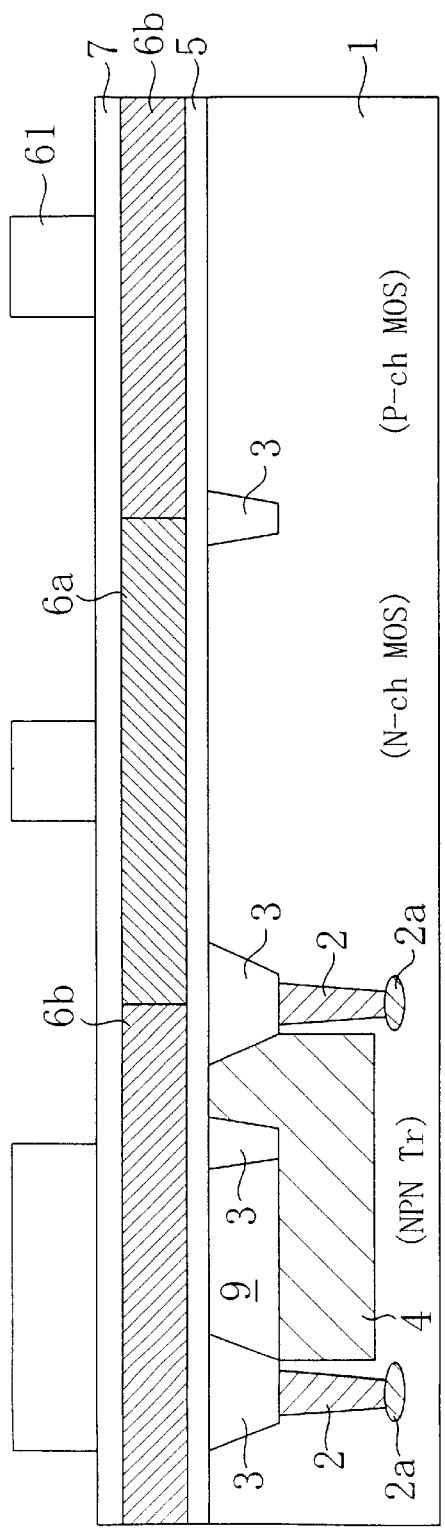
FIGS. 9(a) and 9(b) are cross-sectional views illustrating respective steps, in which a resist pattern for patterning a first polysilicon film and then lightly doped source/drain regions for respective MOS transistors are formed, in a fabrication process for a BiCMOS device according to a second embodiment.
Figure 9B:
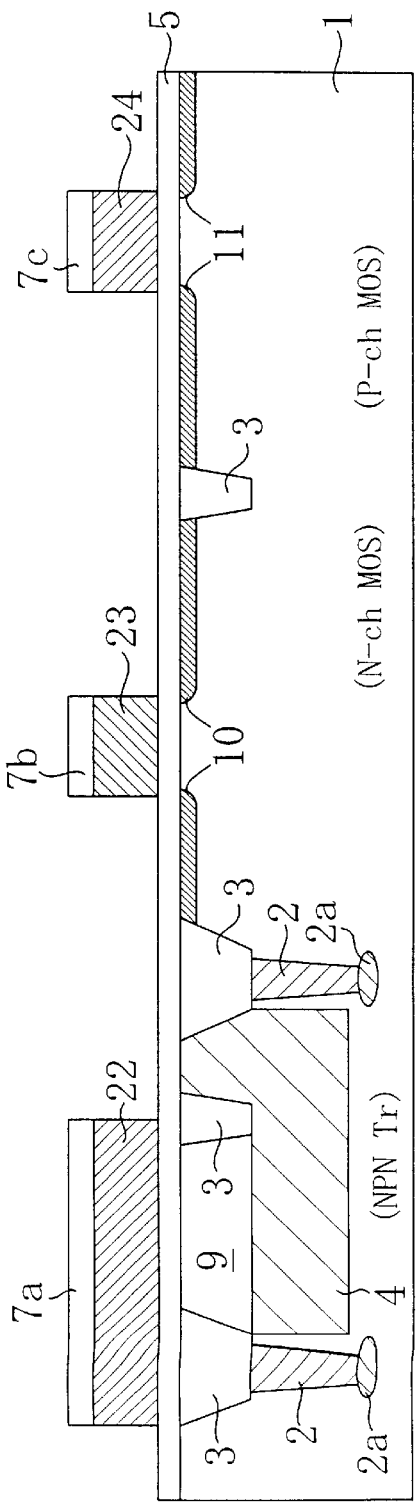
Figure 13A:
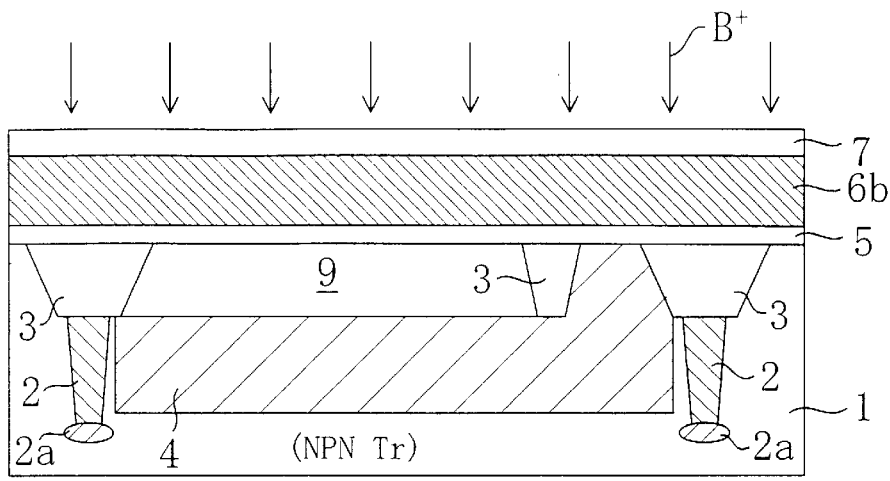
FIGS. 13(a) through 13(c) are cross-sectional views illustrating respective steps, in which boron ions are implanted into a first polysilicon film and then a nitride film for forming a sidewall is formed on the side faces of a first opening, in a fabrication process for a BiCMOS device according to a third embodiment.
Figure 13B:
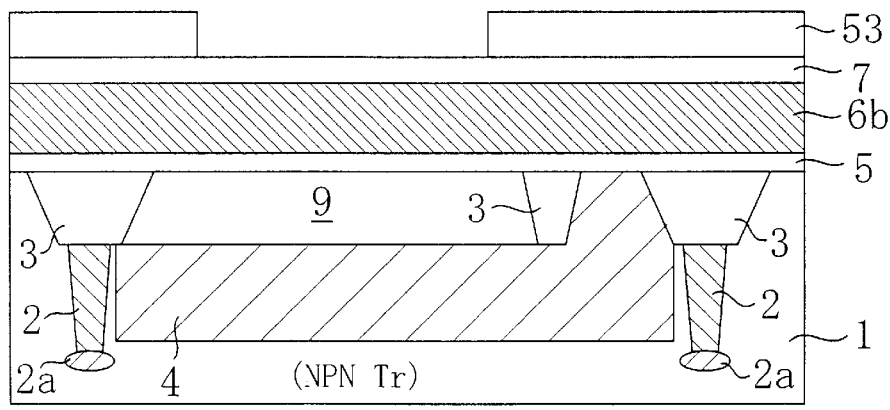
Figure 13C:
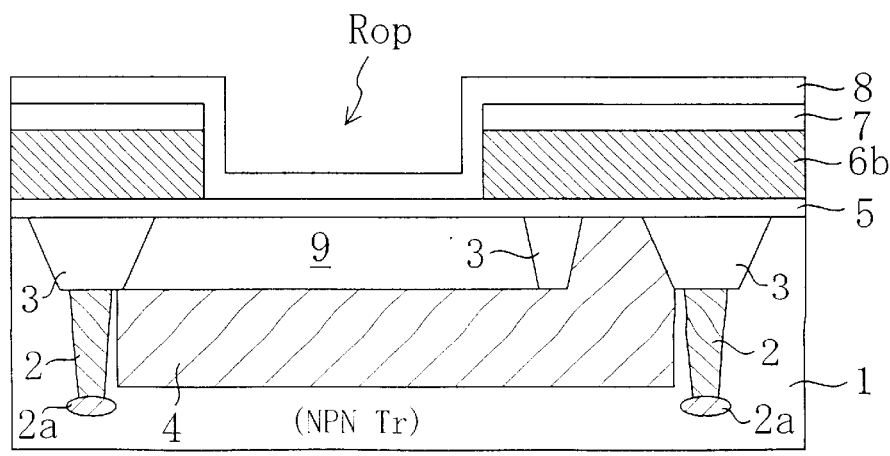

Until the process step shown in FIG. 9(a), the same process steps as those of the first embodiment shown in FIGS. 2(a) through 3(a) are carried out.

And in the process step shown in FIG. 9(a), a resist pattern 61, covering regions where base extended electrodes will be formed for an NPN transistor and regions where gate electrodes will be formed for respective transistors in the CMOS block, is defined on the passivation film 7. Thereafter, in the process step shown in FIG. 9(b), the passivation film 7 and n-type and p-type polysilicon films 6a and 6b are patterned in this order by a dry etching process using this resist pattern 61 as a mask. In this manner, a base extended electrode 22 and an on-base passivation film 7a are formed for an NPN bipolar transistor. A gate electrode 23 and an ongate passivation film 7b are formed for an n-channel MOS transistor. And a gate electrode 24 and an on-gate passivation film 7c are formed for a p-channel MOS transistor. Subsequently, a resist pattern (not shown), covering the NPN bipolar transistor block and a region where a p-channel MOS transistor will be formed, is defined over the substrate. Thereafter, phosphorus ions ($P^+$) are implanted into the silicon substrate 1 using this resist pattern and the gate electrode 23 as a mask, thereby forming lightly doped source/drain regions 10 (LDD regions) for an n-channel MOS transistor. Further, a resist pattern, covering the NPN bipolar transistor block and a region where an n-channel MOS transistor will be formed, is defined over the substrate. Thereafter, boron fluoride ions ($BF_2^+$) are implanted into the silicon substrate 1 using this resist pattern and the gate electrode 24 as a mask, thereby forming lightly doped source/drain regions 11 (LDD regions) for a p-channel MOS transistor.

Next, in the process step shown in FIG. 10(a), a silicon dioxide film is deposited to a thickness of about 120 nm over the substrate. Then, the silicon dioxide film is etched anisotropically by a dry etching technique, thereby forming oxide film sidewalls 25a, 25b, 25c and 25d on the side faces of the emitter extended electrode 21, base extended electrodes 22 and gate electrodes 23 and 24, respectively.

Subsequently, in the process step shown in FIG. 10(b), a resist pattern (not shown), covering the NPN bipolar transistor block and the region where a p-channel MOS transistor will be formed, is defined over the substrate. Thereafter, arsenic ions ($As^+$) are implanted into the silicon substrate 1 using this resist pattern, gate electrode 23 and oxide film sidewall 25c as a mask, thereby forming heavily doped source/drain regions 12 for an n-channel MOS transistor. Further, a resist pattern, covering the NPN bipolar transistor block and the region where an n-channel MOS transistor will be formed, is defined over the substrate. Thereafter, boron fluoride ions ($BF_2^+$) are implanted into the silicon substrate 1 using this resist pattern, gate electrode 24 and oxide film sidewall 25d as a mask, thereby forming heavily doped source/drain regions 13 for a p-channel MOS transistor.

Next, in the process step shown in FIG. 11(a), an etch stopper oxide film 35 is deposited to a thickness of about 20 nm. The thickness of this etch stopper oxide film 35 is determined by taking portions to be removed when nitride film sidewall and emitter electrode are formed and their functions into consideration.

Next, in the process step shown in FIG. 11(b), a resist pattern 62, which has an opening over a region where a base will be formed for an NPN transistor, is defined on the etch stopper oxide film 35. Then, the etch stopper oxide film 35, on-base oxide film 7a and base extended electrodes 22 are dry etched and patterned in this order using the resist pattern 62 as a mask to form a first opening Rop in parts of the etch stopper oxide film 35 on-base oxide film 7a and base extended electrodes 22 where base and emitter will be formed.

Next, in the process step shown in FIG. 12(a), a silicon nitride film is deposited to a thickness of about 120 nm over the substrate by a CVD process. Then, the silicon nitride film is etched anisotropically by a dry etching technique, thereby forming a nitride film sidewall 8a on the side faces of the etch stopper oxide film 35, on-base oxide film 7a and base extended electrodes 22 inside the first opening Rop in the region where an NPN bipolar transistor will be formed.

Subsequently, a wet etching process is performed using a process solution such as hydrofluoric acid to remove the silicon dioxide film. In this process step, a portion of the first insulating film 5 is removed to form a second opening Ret. The removed portion of the first insulating film 5 includes part exposed inside the first opening Rop, part located under the nitride film sidewall 8a and part located under the p-type polysilicon film 6b. It should be noted that the etch stopper oxide film 35 is also etched when the first insulating film 5 is etched with hydrofluoric acid. Therefore, the difference in etch rate between the first insulating film 5 and etch stopper oxide film 35 and the thickness of the oxide film on the base extended electrodes to be left in the state shown in FIG. 12(a) should be taken into consideration to appropriately determine the thickness of the etch stopper oxide film 35, for example.

Next, in the process step shown in FIG. 12(b), a boron-doped SiGe layer 201 is formed on the silicon substrate 1 inside the first and second openings Rop and Ret by a UHV-CVD technique. Specifically, a mixture of disilane, germane and diborane gases is introduced into a chamber of a CVD apparatus and the temperature and vacuum inside the chamber are kept at about 550° C. and at $1\times10^{-3}$ Torr (0.13 Pa), respectively. In this process step, the epitaxial growth is carried out under such conditions that the Ge mole fraction of the SiGe layer 20 is 15% ($Si_{0.85}Ge_{0.15}$) initially and then decreases almost continuously to reach almost 0% when the epitaxial growth is finished. In this process step, the vacuum inside the chamber may be reduced by the UHV-CVD technique and the epitaxial growth rate may be controlled by the surface reaction. In this manner, the SiGe layer 20 can be easily deposited only on the surface of the silicon substrate 1, not on the surfaces of the oxide and nitride films, thus realizing the intended selective epitaxial growth. As a result, the SiGe layer 20 is formed only inside the first and second openings Rop and Ret in the region where an NPN transistor will be formed, while no SiGe is grown on the surfaces of the oxide and nitride films existing in other regions. It is noted that a polycrystalline SiGe layer might be deposited slightly on the lower edge of the p-type polysilicon film 6b, which is exposed inside the second opening Ret.

Thereafter, a natural oxide film, formed on the surface of the SiGe layer 20, is removed with hydrofluoric acid and then a second polysilicon film is deposited to a thickness of about 200 nm over the substrate under such conditions that the deposition of an oxide film is suppressed. Further, phosphorus ions ($p^+$) are introduced into the second polysilicon film at $5\times10^{20}$ cm$^{-3}$ by ion implantation. Furthermore, a resist pattern 63, covering only a region where an emitter extended electrode will be formed, is defined on the second polysilicon film. Subsequently, the second polysilicon film is dry-etched and patterned using this resist pattern 63 as a mask, thereby forming an emitter extended electrode 21.

Subsequent process steps are not shown in the drawings. By carrying out the same process steps as those succeeding the step shown in FIG. 8 for the first embodiment, a BiCMOS device with almost the same structure as the BiCMOS device shown in FIG. 1 can be formed.

In the method for fabricating a BiCMOS device according to this embodiment, the order in which the processes of forming the bipolar transistor and CMOS blocks are performed is just reverse to the first embodiment. Accordingly, as in the fabricating method of the first embodiment, the number of steps of a BiCMOS process can be reduced and the productivity and throughput can be increased.

Particularly, in this embodiment, phosphorus, not arsenic, is introduced into the second polysilicon film, and the phosphorus can be diffused into the emitter layer without performing an annealing process at a high temperature. Accordingly, the thermal budget after the deposition of the SiGe layer can be reduced, and this process step is advantageous where lattice strain has increased due to a high Ge concentration.

In this embodiment, the thickness of the first insulating film 5 is preferably 3 nm or more and 10 nm or less for the same reason as the first embodiment.

Embodiment 3

Next, a third embodiment of the present invention will be described. FIGS. 13(a) through 15(b) are cross-sectional view illustrating respective process steps for fabricating a BiCMOS device according to the third embodiment. It is noted that this and first embodiments differ only in the procedure of forming an NPN bipolar transistor block. Therefore, only the NPN bipolar transistor block is shown in FIGS. 13(a) through 15(b).

The process steps shown in FIGS. 13(a) through 13(c) and FIG. 14(a) are the same as those shown in FIGS. 2(a) through 4(b).

Figure 14A:
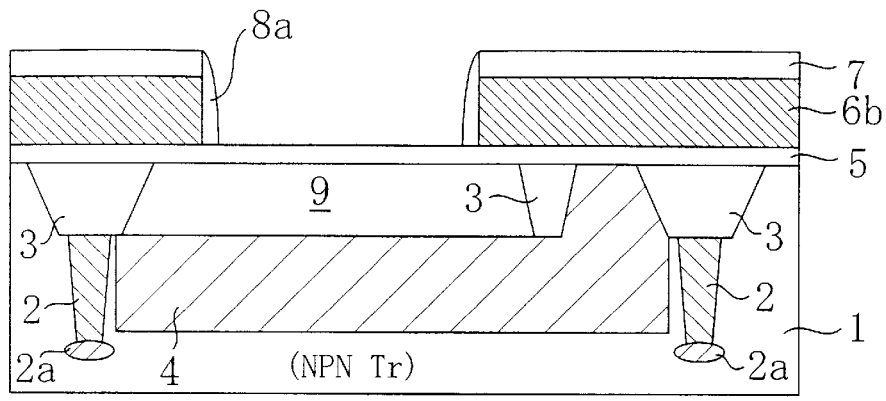
FIGS. 14(a) through 14(c) are cross-sectional views illustrating respective steps, in which a sidewall is formed on the side faces of the first opening and then parts hanging from the polysilicon film are formed in the second opening, in the fabrication process of the BiCMOS device of the third embodiment.
Figure 14B:
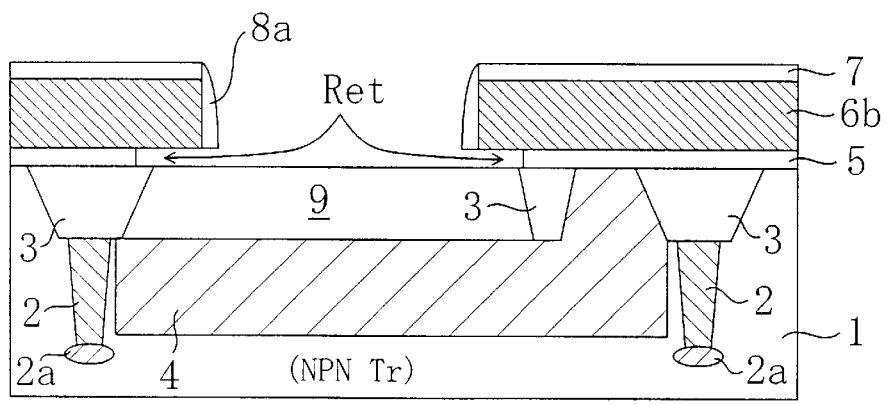

And in the process step shown in FIG. 14(b), a wet etching process is performed to remove the first insulating film 5 with an etchant such as hydrofluoric acid, e.g., buffered hydrofluoric acid. In this process step, a portion of the first insulating film 5 is removed to form a second opening Ret. The removed portion of the first insulating film 5 includes part exposed inside the first opening Rop, part located under the nitride film sidewall 8a and part located under the p-type polysilicon film 6b. Thereafter, the surface of the silicon substrate 1, exposed inside the first and second openings Rop and Ret, is treated with a mixture of ammonia water and hydrogen peroxide water to form a chemical oxide thereon. This chemical oxide is characterized by being less dense and more reactive than an ordinary thermal oxide film. Subsequently, by performing an annealing process at about 850° C. for 10 minutes in an ultra high vacuum of $1\times10^{-9}$ Torr ($1.3\times10^{-7}$ Pa) to $1\times10^{-10}$ Torr ($1.3\times10^{-8}$ Pa), the chemical oxide is sublimated and removed as SiO.

In this process step, the reason is not clear but it was found that if the substrate is heated in an ultra high vacuum to remove a natural oxide film from the surface of the polysilicon film, the outward migration of polysilicon from the exposed surface of the polysilicon film intensifies, thus forming protrusions with spherical surface.

Figure 14C:
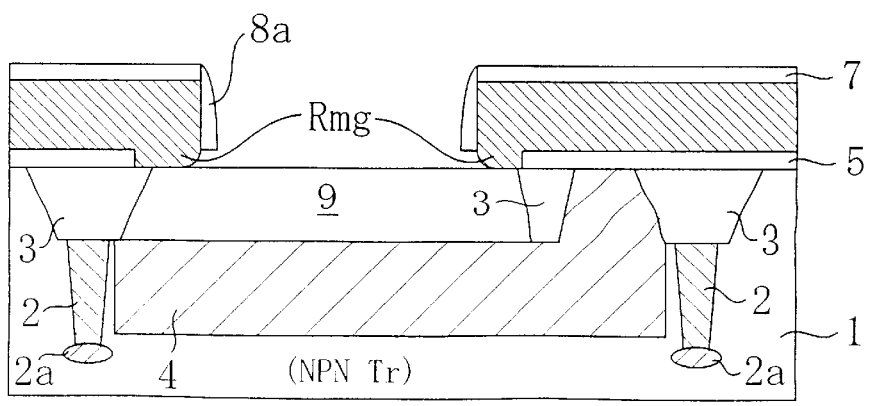

Accordingly, in this embodiment, by utilizing this phenomenon, the substrate is heated in the ultra high vacuum to cause downward migration of polysilicon from the lower edge of the p-type polysilicon film 6b exposed inside the second opening Ret, thus forming hanging parts Rmg with a spherical surface as shown in FIG. 14(c). The shape of these hanging parts Rmg generally depends on the size of the exposed surface of the polysilicon film. In this embodiment, the exposed surface with a width of about 0.2 $\mu$m exists at the lower edge of the p-type polysilicon film 6b, and these hanging parts Rmg are in contact with the surface of the substrate inside the second opening Ret. As a result, boron in the p-type polysilicon film 6b diffuses into the silicon substrate 1, thus forming p-type regions 9a in the collector diffused layer 9. By optimizing the sizes of masks for forming the collector diffused layer 9 and base opening pattern 53, junction capacitance between base and collector, including the p-type regions 9a formed in the collector diffused layer 9, can be reduced.

Figure 15A:
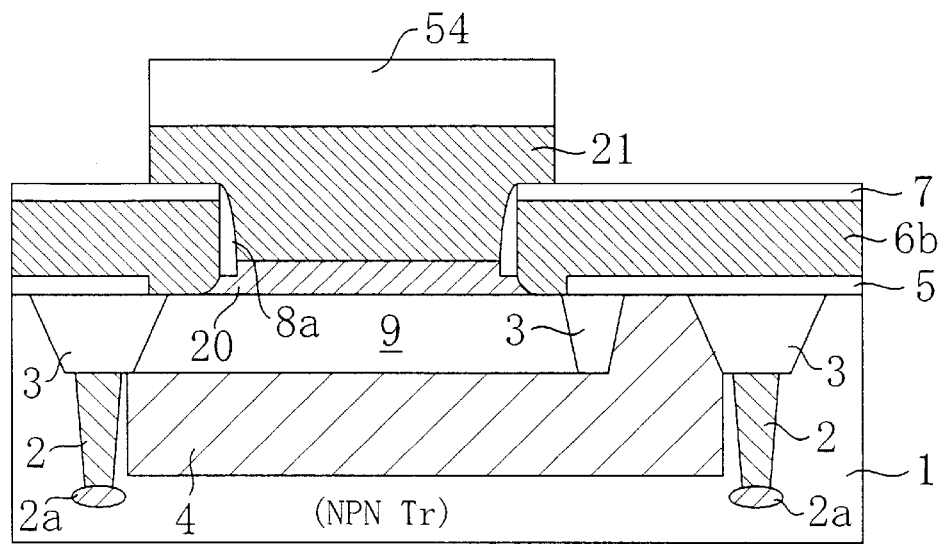
FIGS. 15(a) and 15(b) are cross-sectional views illustrating respective steps, in which an emitter extended electrode is formed and then respective interconnects are formed, in the fabrication process of the BiCMOS device of the third embodiment.
Figure 15B:
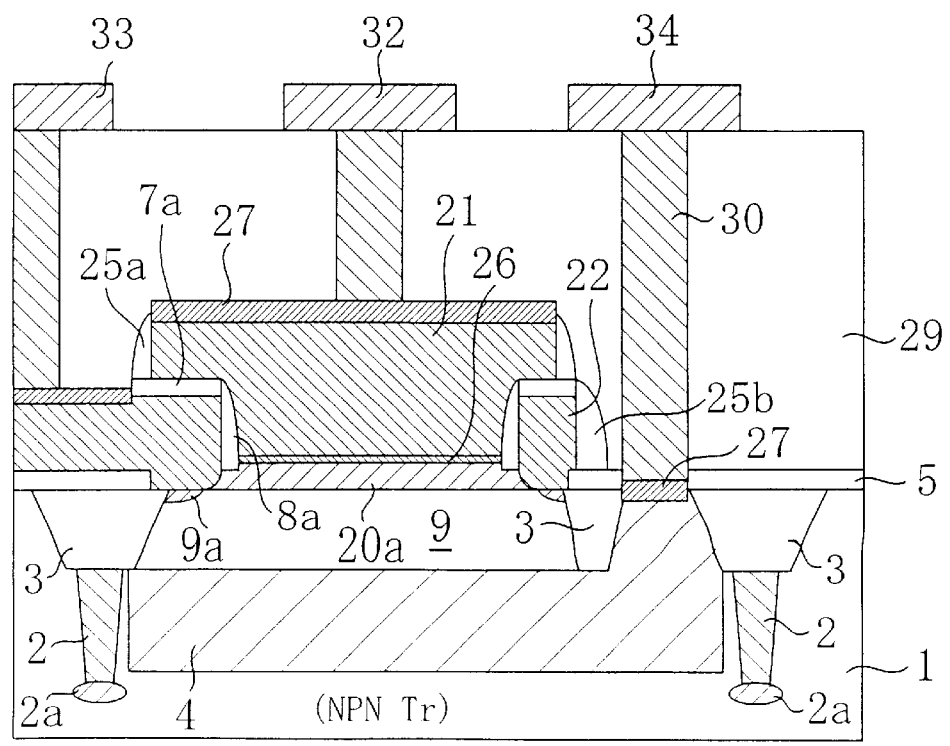

Thereafter, by carrying out the same process steps as those described with reference to FIGS. 6(a) through 8 for the first embodiment, a BiCMOS device including the NPN bipolar transistor shown in FIG. 15(b) can be obtained.

According to the fabricating method of this embodiment, on top of the effects of the fabricating methods of the first and second embodiments, the following effects are attainable.

Generally speaking, an SiGe layer, epitaxially grown on an Si layer, has a lattice strain on the Si layer due to a difference in lattice constant between them. By utilizing a phenomenon that a difference in bandgap between the SiGe and Si layers increases due to this lattice strain, a heterojunction bipolar transistor with a desired characteristic can be obtained. However, if the temperature of the substrate rises, an action of relaxing the strain is produced in the SiGe layer by creating lattice defects such as dislocations. In that case, if the SiGe layer and a silicon dioxide film with mutually different thermal expansion coefficients are in contact, the strain in the SiGe layer is further relaxed, thus degrading the characteristic of a bipolar transistor.

In the fabricating method of this embodiment, the first insulating film 5 (base undercoat insulating film), interposed between the p-type polysilicon film 6b for base extended electrodes and the silicon substrate 1, is thin. Therefore, in the process step shown in FIG. 14(c), if silicon atoms in the p-type polysilicon film 6b migrate and go downward, the hanging parts Rmg come in contact with the surface of the silicon substrate 1 easily. As a result, the SiGe layer 20 to be formed later will not be in contact with the first insulating film 5 (see FIG. 15(a)), and the degradation in characteristic of a bipolar transistor, resulting from relaxed strain of the SiGe layer 20, can be prevented. Further, the surface of the hanging parts Rmg of the p-type polysilicon film 6b is spherical, and the contact area between the base extended electrodes 22 and base layer 20a can be increased in the resultant shape (see FIG. 15(b)), thus reducing base resistance.

In this case, only a voltage in the direction opposite to the pn junction is applied between the base extended electrodes 22 and collector diffused layer 9, and no current flows between the base extended electrodes 22 and collector diffused layer 9.

Also, part of the collector diffused layer 9 for a bipolar transistor, which is adjacent to the shallow trench isolations 3, is a region where strain resulting from stress, various types of damage and junction leakage are brought about easily. However, as in this embodiment, by changing part of the collector diffused layer 9, which is adjacent to the shallow trench isolations 3, into the p-type regions 9a, most of the pn junction shifts downward from the surface of the substrate. As a result, leakage current due to damage or defects crossing the pn junction can be suppressed. To suppress these types of leakage current, a wide margin has been considered, but the margin and size of the element can be reduced according to this embodiment.

It should be noted that a mixture of ammonia water and hydrogen peroxide water is used to form a chemical oxide in this embodiment. Alternatively, similar chemical oxide may be formed using a mixture of hydrochloric acid and hydrogen peroxide water.

Further, self-aligned base/emitter and base/collector regions can be formed, and therefore, a stabilized characteristic is obtainable even if the device is downsized.

It should be noted that the foregoing embodiments have been described on the supposition that an NPN transistor is formed in the bipolar transistor block. However, even if a PNP transistor is formed, the above-described effects can also be obtained by applying the present invention because the conductivity type of the dopant to be introduced into the emitter layer 26, base layer 20a, collector diffused layer 9 and subcollector layer is just inverted.

Further, the present invention is applicable to a semiconductor device including a homojunction bipolar transistor, of which the base layer is made of Si single crystals.

Also, in this embodiment, the thickness of the first insulating film 5 is preferably 3 nm through 10 nm for the same reason as the first embodiment.

Embodiment 4

Figure 16:
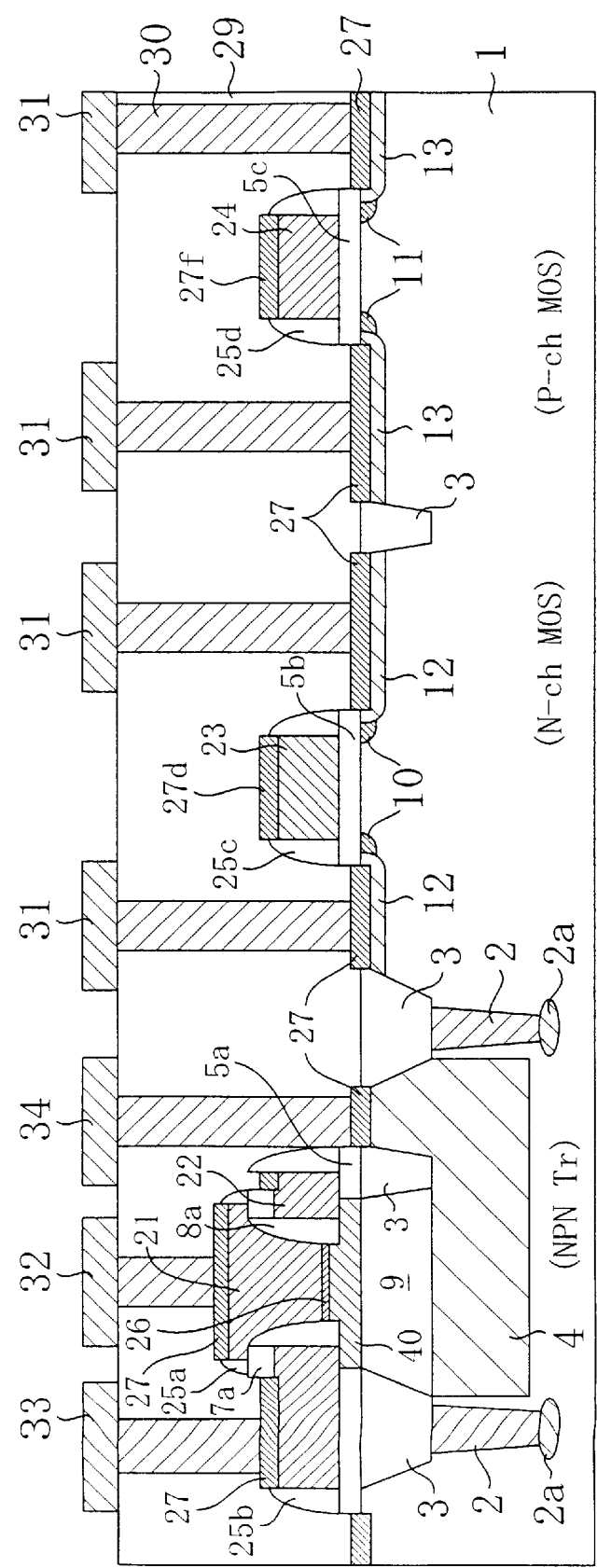
FIG. 16 is a cross-sectional view illustrating a structure for a BiCMOS device according to a fourth embodiment.

Next, a fourth embodiment of the present invention will be described. FIG. 16 is a cross-sectional view illustrating a structure for a BiCMOS device according to the fourth embodiment.

The structure of the BiCMOS device shown in FIG. 16 is basically the same as that of the BiCMOS device according to the first embodiment shown in FIG. 1. Accordingly, the same members as the counterparts shown in FIG. 1 are identified by the same reference numerals as those used in FIG. 1 and the description thereof will be omitted. This embodiment differs in that, in the NPN bipolar transistor block, a base layer 40 is made of SiGeC single crystals instead of SiGe single crystals. The SiGeC single crystals are characterized in that tensile, compressive or no strain can be created selectively between the SiGeC single crystals and the Si layer by controlling the Ge and C mole fractions.

Figure 17:
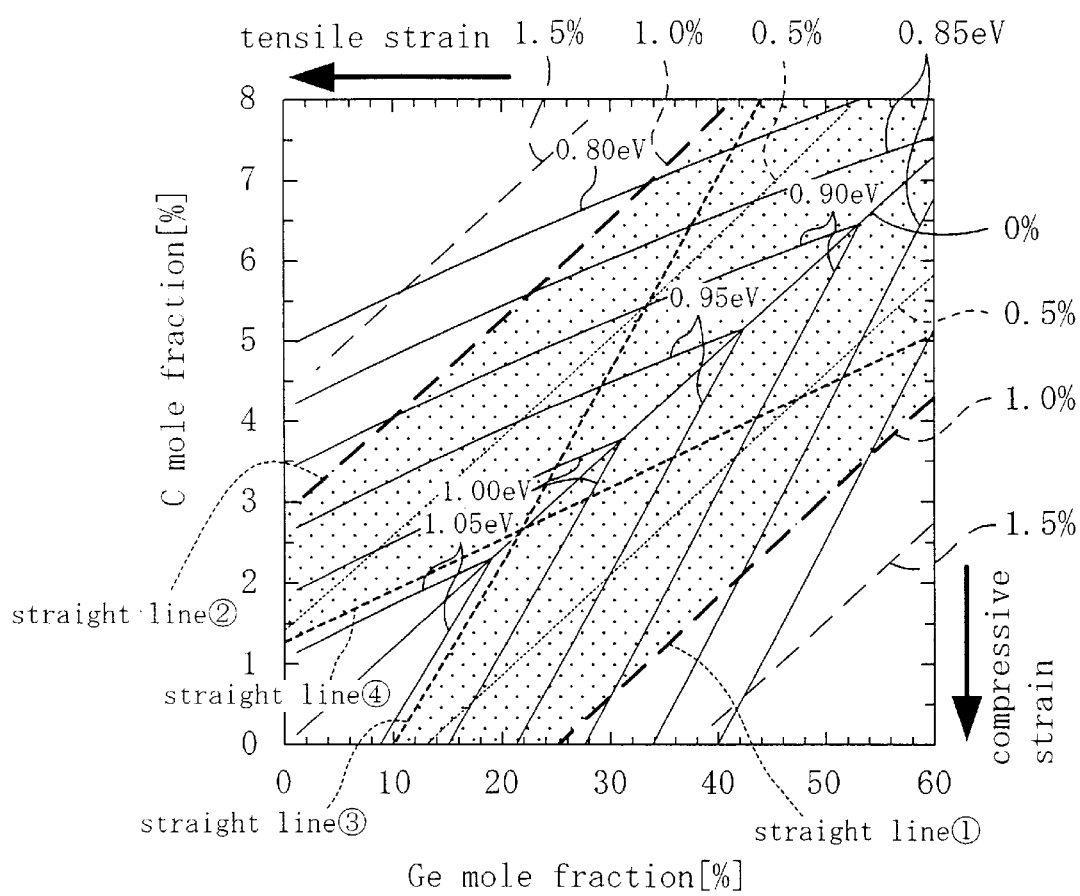
FIG. 17 is a graph illustrating how the Ge and C mole fractions, bandgap and lattice strain are related in SiGeC ternary mixed crystal semiconductor used in the fourth embodiment.

FIG. 17 is a graph illustrating how the Ge and C mole fractions, bandgap and lattice strain are related in SiGeC ternary mixed crystal semiconductor. In FIG. 17, the abscissa represents the Ge mole fraction and the ordinate represents the C mole fraction. Also, a composition associated with a constant strain (including compressive and tensile strains) and a constant bandgap is represented by a straight line. In FIG. 17, the dot-hatched region is a region where the lattice strain of the SiGeC layer on the Si layer is within 1.0% and the bandgap thereof can be narrower than that of the known and practical SiGe (with a Ge mole fraction of about 10%). This region of the SiGeC represented as $Si_{1-x-y}Ge_xC_y$, where x and y are the Ge and C mole fractions, is surrounded by the following four straight lines:

straight line ①: y=0.122x−0.032
straight line ②: y=0.1245x+0.028
straight line ③: y=0.2332x−0.0233 (with a Ge mole fraction of 22% or less)
straight line ④: y=0.0622x+0.0127 (with a Ge mole fraction of 22% or less)

It should be noted that an SiGe layer, which has a composition represented by the straight line associated with a 0% lattice strain in FIG. 17, lattice-fits with the underlying Si layer.

Accordingly, in this embodiment, by appropriately changing the mole fractions of Ge and C in the SiGeC single crystals, which make up the base layer 40, not only strain due to a lattice misfit between the base layer 40 and collector diffused layer 9 but also stress applied to the base layer 40 from its surrounding member, e.g., the first insulating film 5a, can be controlled. For example, where a compressive stress is applied from the first insulating film 5a, the composition of the SiGeC single crystals is controlled so as to apply a tensile stress to the base layer 40 from the collector diffused layer 9. On the other hand, where a tensile stress is applied from the first insulating film 5a, the composition of the SiGeC single crystals is controlled so as to apply a compressive stress to the base layer 40 from the collector diffused layer 9. In this manner, the stress applied to the base layer 40 can be reduced as much as possible. Conversely, if an appropriately controlled stress should be applied between the base layer 40 and collector diffused layer 9, the composition of the SiGeC single crystals can be adjusted by estimating the stress applied from the first insulating film 5a beforehand. In other words, by adjusting the composition of the SiGeC single crystals, the stress applied to the base layer 40 can be controlled at, or as close as possible to, a desired value and a bipolar transistor exhibiting a high performance in terms of its high frequency characteristic, for example, can be obtained.

The fabricating process of the BiCMOS according to this embodiment is almost the same as that of the first embodiment except the process of forming the single crystal SiGeC layer for the base layer 40. It is noted that, in an epitaxial growth process for forming the single crystal SiGeC layer, flow rates of disilane ($Si_2H_6$), germane ($GeH_4$) and methylsilane (10% $SiH_3CH_3/H_2$) are set to 7.5 ml/min., 20 ml/min. and 10 ml/min., respectively, and the growth temperature and growth pressure are set to 500° C. and about $4\times10^{-3}$ Torr (0.53 Pa), respectively, inside a UHV-CVD apparatus.

Modified Example of Embodiment 4

Figure 18:
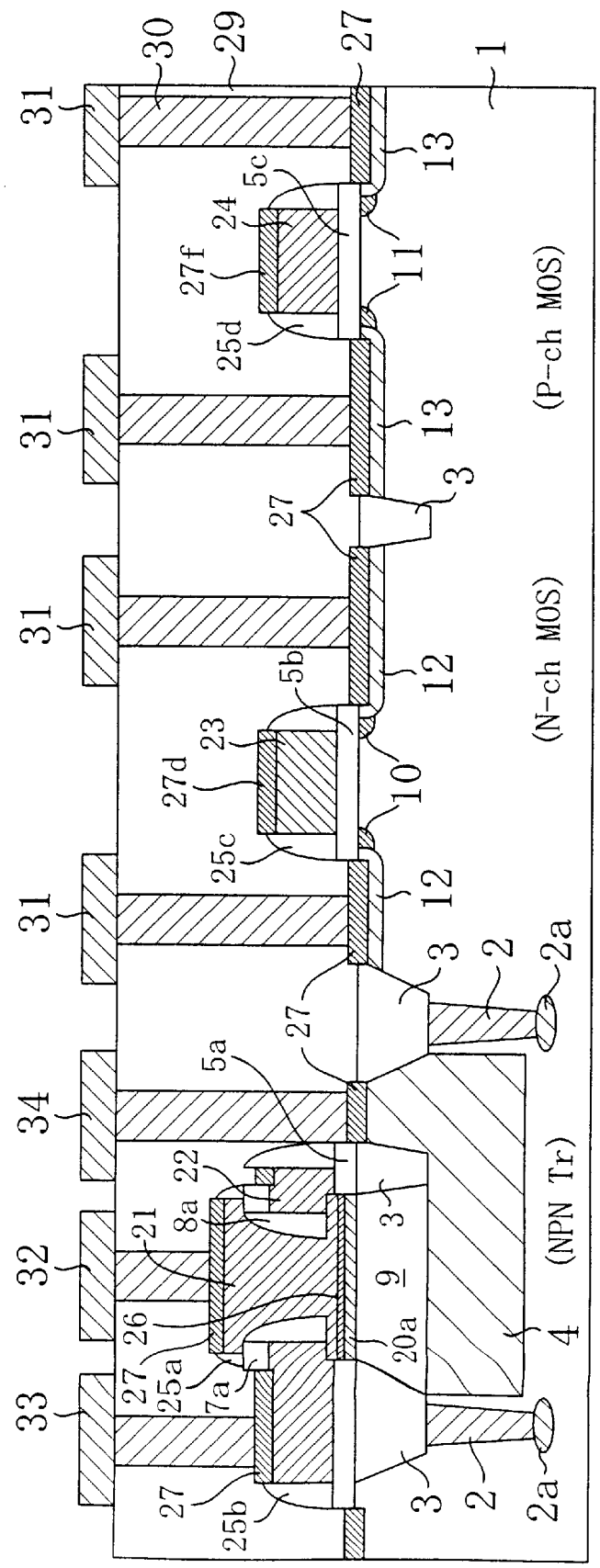
FIG. 18 is a cross-sectional view illustrating a structure for a BiCMOS device in a modified example of the fourth embodiment.

FIG. 18 is a cross-sectional view illustrating a structure for a BiCMOS device according to a modified example of the fourth embodiment. The structure of the BiCMOS device shown in FIG. 18 is basically the same as that of the BiCMOS device of the first embodiment shown in FIG. 1. Accordingly, the same members as the counterparts shown in FIG. 1 are identified by the same reference numerals as those used in FIG. 1 and the description thereof will be omitted herein. This embodiment is the same as the fourth embodiment in that the base layer 41 is made of SiGeC single crystals but different from the fourth embodiment in that the thickness of the base layer 41 is about 20 nm and is thinner than the first insulating film 5a. In this case, the thickness of the first insulating film 5a is about 50 nm, which is considerably thicker than the gate insulating films 5b and 5c with a thickness of 7 nm for the MIS transistor block.

Even in such an embodiment, by adjusting the composition of the SiGeC single crystals that make up the base layer 41, the stress applied to the base layer 41 can be controlled appropriately as described above.

Industrial Applicability

The semiconductor device and fabricating method thereof of the present invention is applicable to a bipolar transistor built in an electronic unit, and more particularly to an Si—SiGe or Si—SiGeC bipolar transistor and a fabricating method thereof.

What is claimed is:

1. A semiconductor device comprising:
   a substrate having a semiconductor layer at least in a surface region thereof;
   a collector layer of a first conductivity type, which is provided in the semiconductor layer;
   a base extended electrode, which is provided over the collector layer and is formed out of a conductor film with a first opening;
   a base undercoat insulating film, which is interposed between the substrate and the base extended electrode and has a second opening wider than the first opening;
   a base layer of a second conductivity type, which is provided on the semiconductor layer and includes a peripheral portion and a center portion, the peripheral portion being in contact with a lower edge of the base extend electrode around a periphery of the first opening, the center portion being located in an inner region of the second opening and deposited thicker than the peripheral portion;
   an emitter layer of the first conductivity type which is provided inside the first opening of the base extended electrode and is in contact with the upper surface of the center portion of the base layer;
   a bipolar transistor composed of an insulator film interposed between a side face of the first opening of the base extended electrode and the base and emitter layers;
   a gate insulating film formed out of an insulating film same as that of the undercoat insulating film and is provided on the semiconductor layer; and
   an MIS transistor formed out of a gate electrode provided on the gate insulating film.

2. A semiconductor device according to claim 1, characterized in that the lower edge of the base extended electrode around the periphery of the first opening is extended to be in contact with the collector layer along a side face of the second opening of the base undercoat insulating film, and
   that the peripheral portion of the base layer is separated from the base undercoat insulating film by the lower edge of the base extended electrode.

3. A semiconductor device according to claim 1 or 2, characterized in that the collector layer is made of Si single crystals, and
   that the base layer is made of SiGe single crystals, and
   that the emitter layer is made of Si single crystals, and
   that the semiconductor device is a heterojunction bipolar transistor.

4. A semiconductor device according to claim 1 or 2, characterized in that the collector layer is made of Si single crystals, and
   that the base layer is made of SiGeC single crystals, and
   that the emitter layer is made of Si single crystals, and that the semiconductor device is a heterojunction bipolar transistor.

5. A semiconductor device according to one of claims 1 to 4, characterized in that the base extended electrode of the bipolar transistor and the gate electrode of the MIS transistor are formed out of the same conductor film.

6. A method for fabricating a semiconductor device, the device including a bipolar transistor that comprises: a collector layer of a first conductivity type, formed out of a first semiconductor layer; a base layer of a second conductivity type, formed out of a second semiconductor layer; an emitter layer of the first conductivity type, formed out of a third semiconductor layer; a base extended electrode formed out of a first conductor film; an emitter extended electrode formed out of a second conductor film; a gate insulating film formed out of a first insulator film; and a gate electrode formed out of the first conductor film; the method characterized by comprising the steps of:

(a) forming a first insulator film on the first semiconductor layer existing at least in a surface region of a substrate;

(b) forming the first conductor film on the first insulator film;

(c) forming a first opening in the first conductor film to expose the first insulator film;

(d) etching isotropically part of the first insulator film, which part is exposed inside the first opening, to form a second opening, which is wider than the first opening, in the first insulator film, thereby exposing the first semiconductor layer;

(e) forming the second semiconductor layer, including a peripheral portion and a center portion, on the first semiconductor layer by an epitaxial growth process, the peripheral portion being in contact with a lower edge of the first conductor film around a periphery of the first opening, the center portion being located in an inner region of the first opening of the first conductor film and deposited thicker than the peripheral portion;

(f) forming the third semiconductor layer on the second semiconductor layer; and (g) forming the second conductor film over the substrate after the step (f) has been performed.

7. A method for fabricating a semiconductor device according to claim 6, characterized by further comprising the step of patterning the first conductor film to form the base extended electrode of the bipolar transistor and a gate electrode for an MIS transistor at a time.

8. A method for fabricating a semiconductor device according to claim 6 or 7, characterized by further comprising the step of removing an oxide film from an exposed part of the first conductor film by performing an annealing process in an ultra high vacuum between the steps (d) and (e), thereby making a part of the first conductor film, hanging from the lower edge thereof around the periphery of the first opening, come into contact with the first semiconductor layer.

9. A method for fabricating a semiconductor device according to claim 7, characterized in that the first semiconductor layer is an Si layer, and that a single crystal SiGe layer is formed as the second semiconductor layer in the step (e), and that a single crystal Si layer is formed as the third semiconductor layer in the step (f).

10. A method for fabricating a semiconductor device according to claim 7, characterized in that the first semiconductor layer is an Si layer, and that a single crystal SiGeC layer is formed as the second semiconductor layer in the step (e), and that a single crystal Si layer is formed as the third semiconductor layer in the step (f).

* * * * *

UNITED STATES PATENT AND TRADEMARK OFFICE
CERTIFICATE OF CORRECTION

PATENT NO. : 6,399,993 B1
DATED : June 4, 2002
INVENTOR(S) : Teruhito Ohnishi et al.

It is certified that error appears in the above-identified patent and that said Letters Patent is hereby corrected as shown below:

<u>Title page,</u>
Item [73], Assignee, delete "Kanagawa-ken", insert -- Osaka --

Signed and Sealed this

Nineteenth Day of November, 2002

*Attest:*

*Attesting Officer*

JAMES E. ROGAN
*Director of the United States Patent and Trademark Office*